US 6,645,697 B2

(12) United States Patent
Urano

(10) Patent No.: US 6,645,697 B2
(45) Date of Patent: Nov. 11, 2003

(54) PHOTOPOLYMERIZABLE COMPOSITION AND PHOTOPOLYMERIZABLE LITHOGRAPHIC PRINTING PLATE

(75) Inventor: Toshiyuki Urano, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 10/079,408

(22) Filed: Feb. 22, 2002

(65) Prior Publication Data

US 2002/0114966 A1 Aug. 22, 2002

Related U.S. Application Data

(63) Continuation of application No. PCT/JP00/05588, filed on Aug. 21, 2000.

(30) Foreign Application Priority Data

Aug. 23, 1999 (JP) ............................. 11-235216
Jul. 3, 2000 (JP) ........................ 2000-200400
Jul. 10, 2000 (JP) ........................ 2000-207841
Jul. 10, 2000 (JP) ........................ 2000-207842

(51) Int. Cl.$^7$ .............................................. G03F 7/038
(52) U.S. Cl. ................................ 430/281.1; 430/286.1; 430/287.1; 430/348; 430/964
(58) Field of Search ........................... 430/270.1, 281.1, 430/286.1, 287.1, 288.1, 302, 348, 944, 945, 964

(56) References Cited

U.S. PATENT DOCUMENTS

| 4,772,541 A | | 9/1988 | Gottschalk et al. ......... 430/339 |
|---|---|---|---|
| 4,800,149 A | | 1/1989 | Gottschalk et al. ......... 430/138 |
| 4,865,942 A | | 9/1989 | Gottschalk et al. ......... 430/138 |
| 5,219,709 A | * | 6/1993 | Nagasaka et al. ....... 430/281.1 |
| 5,700,849 A | * | 12/1997 | Kondo et al. ................ 522/16 |
| 5,807,659 A | * | 9/1998 | Nishimiya et al. .......... 430/302 |
| 5,814,431 A | * | 9/1998 | Nagasaka et al. ....... 430/281.1 |
| 6,153,356 A | * | 11/2000 | Urano et al. ............. 430/281.1 |
| 6,159,657 A | * | 12/2000 | Fleming et al. .......... 430/270.1 |
| 6,232,038 B1 | * | 5/2001 | Takasaki et al. ......... 430/281.1 |
| 6,335,144 B1 | * | 1/2002 | Murota et al. ........... 430/281.1 |
| 6,410,202 B1 | * | 6/2002 | Fleming et al. .......... 430/270.1 |
| 2001/0018164 A1 | * | 8/2001 | Furukawa ................. 430/287.1 |
| 2001/0036598 A1 | * | 11/2001 | Shimada et al. ......... 430/281.1 |
| 2002/0009669 A1 | * | 1/2002 | Morishima et al. .... 430/270.18 |
| 2002/0160295 A1 | * | 10/2002 | Aoshima et al. ........... 430/176 |

FOREIGN PATENT DOCUMENTS

| JP | 62-143044 | | 6/1987 | | |
|---|---|---|---|---|---|
| JP | 8-114916 | | 5/1996 | | |
| JP | 11-119421 | | 4/1999 | | |
| JP | 11-119428 | | 4/1999 | | |
| JP | 2000-98602 | | 4/2000 | | |
| JP | 2002090989 A | * | 3/2002 | ........... | G03F/7/004 |
| JP | 2002122988 A | * | 4/2002 | ........... | G03F/7/027 |

* cited by examiner

Primary Examiner—Janet Baxter
Assistant Examiner—Barbara Gilliam
(74) Attorney, Agent, or Firm—Oblon, Spivak, McClelland, Maier & Neustadt, P.C.

(57) ABSTRACT

A photopolymerizable composition which is highly sensitive to light in the visible region and long-wavelength regions including the near infrared region, is not sensitive to light in the ultraviolet region, and has excellent handling efficiency under day light fluorescent lamps. The composition contains an ethylenically unsaturated compound, a dye which has a basic structure, a photopolymerization initiator, and a photopolymerizable lithographic printing plate which has a support and a layer of the photopolymerizable composition on its surface.

19 Claims, No Drawings

PHOTOPOLYMERIZABLE COMPOSITION AND PHOTOPOLYMERIZABLE LITHOGRAPHIC PRINTING PLATE

This application is a Continuation application of International Application No. PCT/JP00/05588, filed Aug. 21, 2000.

TECHNICAL FIELD

The present invention relates to a photopolymerizable composition and a photopolymerizable lithographic printing plate, particularly to a photopolymerizable composition and a photopolymerizable lithographic printing plate, which shows high sensitivity to light in long-wavelength regions.

BACKGROUND ART

Heretofore, as methods for forming images by exposure of photopolymerizable compositions, various methods have been known, such as, a method wherein a layer of a photopolymerizable composition comprising an ethylenically unsaturated compound and a photopolymerization initiator, or comprising an organic polymer binder material in addition to them, is formed on the surface of a support and then subjected to image exposure so that the ethylenically unsaturated compound at the exposed portion is polymerized and cured, and then the non-exposed portion is dissolved and removed to form a cured relief image, a method wherein a layer of a photopolymerizable composition is exposed to change the bond strength of the layer to the support, and then the support is peeled to form an image, and a method wherein a change in the adhesion of a toner to the layer of a photopolymerizable composition due to light, is utilized to form an image. As the photopolymerization initiator, one which is sensitive to light with a short wavelength within an ultraviolet region of at most 400 nm, has been used, such as benzoin, benzoin alkyl ether, benzyl ketal, benzophenone, anthraquinone, benzyl ketone or Michler's ketone.

On the other hand, in recent years, a photosensitive material showing high sensitivity to a light within a visible light range has been strongly demanded along with the development of the image-forming technology, and many photopolymerizable compositions have been proposed, whereby the sensitivity range has been broadened to about 500 nm corresponding to a laser printing plate making system employing an oscillation beam of an argon ion laser of 488 nm. Further, researches have been actively carried out on photopolymerizable compositions sensitive to a light within a long wavelength region exceeding 600 nm corresponding to a laser printing plate making system employing a He—Ne laser or a semiconductor laser or a copying technique for full color image.

For example, JP-A-62-143044 discloses a photopolymerizable composition comprising a dye cation-organic boron anion complex, and in examples of the dye cation-organic boron anion complex, a complex of an indole type cyanine dye cation with an organic boron anion, having a maximum absorption wavelength of 740 nm, is shown. Further, JP-2000-98602 discloses a photopolymerizable composition comprising a certain specific ethylenically unsaturated compound, a cyanine dye cation and an organic boron anion, which is sensitive to light in long-wavelength regions, and in examples of the cyanine type, a dye having a diphenylamino group as a substituent on the polymethine chain.

However, it is commonly known that with respect to the active radical-forming ability of a photopolymerization initiator, the sensitivity to a light with a wavelength exceeding 500 nm, particularly 600 nm, sharply decreases along with a decrease in the light excitation energy. To a light within such a long wavelength region, none of the conventional photopolymerizable compositions has been satisfactory from the viewpoint of the sensitivity, and in addition, there has been a problem that a photopolymerization reaction is likely to proceed during handling under a white fluorescent lamp, whereby it has been difficult to obtain a product of a uniform quality.

The present invention has been made in view of the above-described prior art, and it is an object of the present invention to provide a photopolymerizable composition and a photopolymerizable lithographic printing plate, which shows high sensitivity to a light in the visible light region or in a long wavelength region such as a near infrared region and which is insensitive to a light in the ultraviolet region and excellent in handling under a white fluorescent lamp.

DISCLOSURE OF THE INVENTION

The present inventors have conducted extensive studies to solve the above problems and as a result, have found it possible to accomplish the above object with a photopolymerizable composition containing a dye which has, as a basic structure, a structure having hetero atoms connected via a polymethine chain, and which has a certain specific substituent on the polymethine chain or on other basic structure. The present invention has been accomplished on the basis of this discovery.

Namely, the present invention provides a photopolymerizable composition comprising the following components (A), (B) and (C), and a photopolymerizable lithographic printing plate comprising a support and, formed on a surface thereof, a layer of the photopolymerizable composition:

(A) an ethylenically unsaturated compound;
(B) a dye which has, as a basic structure, a structure having hetero atoms connected via a polymethine chain and which is selected from the group consisting of the following (B-1), (B-2), (B-3) and (B-4):
  (B-1) a dye having, on a polymethine chain, a substituent containing a chain ether bond which forms an oxonium cation or a chain thioether bond which forms a sulfonium cation, upon resonance in the dye molecule,
  (B-2) a dye having, on a polymethine chain, two substituents forming a cyclic ether bond which forms an oxonium cation or a cyclic thioether bond which forms a sulfonium cation, upon resonance in the dye molecule,
  (B-3) a dye having, on a polymethine chain, a substituent containing an amino-vinyl bond which forms an aminium cation upon resonance in the dye molecule, and
  (B-4) a dye having, on a polymethine chain or other basic structure, a substituent containing an acid anion group, its ester group or a base; and
(C) a photopolymerization initiator.

BEST MODE FOR CARRYING OUT THE INVENTION

The ethylenically unsaturated compound of component (A) constituting the photopolymerizable composition of the present invention, is a monomer having an ethylenically unsaturated double bond which undergoes addition polymerization and, in some cases, undergoes crosslinking or curing, by an action of the photopolymerization initiator of component (C) which will be described hereinafter, when the photopolymerizable composition is irradiated with active light rays, or a polymer having such double bonds in its main chain or side chain. Here, the monomer is meant for a concept opposite to a so-called polymer, and it includes in addition to a monomer in a narrow sense, a dimer, a trimer and other oligomers.

Specifically, such monomers include, for example, (1) unsaturated carboxylic acids such as acrylic acid and methacrylic acid (these two acids may generally be referred to as "(meth)acrylic acid"), (2) alkyl esters of these acids, (3) esters of unsaturated carboxylic acids with aliphatic polyhydroxy compounds, such as ethylene glycol di(meth)acrylate, diethylene glycol di(meth)acrylate, triethylene glycol di(meth)acrylate, trimethylol ethane tri(meth)acrylate, trimethylol propane tri(meth)acrylate, pentaerythritol di(meth)acrylate, pentaerythritol tri(meth)acrylate, pentaerythritol tetra(meth)acrylate, dipentaerythritol tetra(meth)acrylate, dipentaerythritol penta(meth)acrylate, dipentaerythritol hexa(meth)acrylate, glycerol di(meth)acrylate, glycerol tri(meth)acrylate, and the corresponding itaconates, crotonates and maleates, (4) esters of unsaturated carboxylic acids with aromatic polyhydroxy compounds, such as hydroquinone di(meth)acrylate, resorcinol di(meth)acrylate, and pyrogallol tri(meth)acrylate, (5) condensates of polyhydroxy compounds, unsaturated carboxylic acids and polybasic carboxylic acids, such as a condensate of ethylene glycol, (meth)acrylic acid and phthalic acid, a condensate of diethylene glycol, (meth)acrylic acid and maleic acid, a condensate of pentaerythritol, (meth)acrylic acid and terephthalic acid, and a condensate of butane diol, glycerol, (meth)acrylic acid and adipic acid, (6) urethane (meth) acrylates, such as an addition reaction product of a polyisocyanate compound such as tolylene diisocyanate, with a hydroxyl group-containing (meth)acrylate such as hydroxyethyl (meth)acrylate, (7) vinyl urethanes, such as an addition reaction product of a polyisocyanate compound with a hydroxyl group-containing vinyl compound, (8) epoxy (meth)acrylates, such as an addition reaction product of a polyvalent epoxy compound with a hydroxyl group-containing (meth)acrylate such as hydroxyethyl (meth) acrylate, (9) acryloamides, such as ethylene bis(meth) acrylamide, (11) vinyl group-containing compounds, such as divinyl phthalate, and (12) (meth)acryloyl group-containing phosphoric acid esters, such as (meth)acryloyloxyethyl phosphate, and bis((meth)acryloyloxyethyl) phosphate.

As the polymers, specifically those having double bonds in their main chains include, for example, (1) polyesters obtained by a condensation reaction of an unsaturated dicarboxylic acid with a dihydroxy compound, and (2) polyamides obtained by a polycondensation reaction of an unsaturated dicarboxylic acid with a diamine compound, and those having double bonds in their side chains, include, for example, (3) polyesters obtained by a polycondensation reaction of itaconic acid, ethylidenemalonic acid or propylidenesuccinic acid, with a dihydroxy compound, (4) polyamides obtained by a polycondensation reaction of itaconic acid, ethylidenemalonic acid or propylidenesuccinic acid, with a diamine compound, and (5) polymers obtained by a reaction of an unsaturated carboxylic acid with a polymer having reactive functional groups such as hydroxyl groups or halogenated methyl groups in its side chain, such as a polyvinyl alcohol, a poly(2-hydroxyethyl methacrylate) or a polyepichlorohydrin.

Among the above components (A), the ethylenically unsaturated compound of component (A) in the present invention is preferably an acrylate compound, of which the ethylenically unsaturated double bond is derived from a (meth)acryloyloxy group.

The dye of component (B) constituting the photopolymerizable composition of the present invention is a dye which has, as a basic structure, a structure having hetero atoms connected via a polymethine chain and which is selected from the group consisting of the following (B-1), (B-2), (B-3) and (B-4):

(B-1) a dye having, on a polymethine chain, a substituent containing a chain ether bond which forms an oxonium cation or a chain thioether bond which forms a sulfonium cation, upon resonance in the dye molecule, (B-2) a dye having, on a polymethine chain, two substituents forming a cyclic ether bond which forms an oxonium cation or a cyclic thioether bond which forms a sulfonium cation, upon resonance in the dye molecule, (B-3) a dye having, on a polymethine chain, a substituent containing an amino-vinyl bond which forms an aminium cation upon resonance in the dye molecule, and (B-4) a dye having, on a polymethine chain or other basic structure, a substituent containing an acid anion group, its ester group or a base.

Further, "upon resonance in the dye molecule" in the definition of dyes (B-1), (B-2) and (B-3) means in short "upon resonance with a chromophore of the dye". These dyes have the above substituents, whereby the π-electron system of chromophore in the dye molecule will spread thereby to shift the absorption peak towards a long wavelength side usually by at least 20 nm, whereby the absorption efficiency in the near infrared region with a wavelength range of from 700 to 1,300 nm can be improved. Further, the dye (B-4) has the above substituent, whereby the polarity of the dye molecule is increased, and, in the formation of a layer of the photopolymerizable composition on a support, the solubility to the coating solvent is increased to prevent agglomeration in the layer, whereby light ranging from a visible light of at least 600 nm to the near infrared region can efficiently be absorbed. Such a near infrared absorbing dye is a compound which has a sensitizing function such that it efficiently absorbs light within the above wavelength range and conducts the light excitation energy to the photopolymerization initiator of component (C) which will be described hereinafter, to decompose the photopolymerization initiator and to form active radicals which induce polymerization of the above-mentioned ethylenically unsaturated compound of component (A) and which, on the other hand, absorbs no substantial light in the ultraviolet region, or even if it absorbs such light, it is substantially insensitive and thus has no action to modify the composition by such weak ultraviolet rays as contained in a white fluorescent lamp.

In the present invention, such a dye has, as a basic structure, a structure having hetero atoms such as nitrogen atoms, oxygen atoms or sulfur atoms, connected by a polymethine ($-CH=$)$_n$ chain. Such a basic structure is typically represented by a so-called cyanine dye in a broad sense with a structure wherein such hetero atoms form hetero rings and the hetero rings are connected via a polymethine chain. Specifically, it may, for example, be a quinoline type (so-called cyanine type in a narrow sense), an indole type (so-called indocyanine type), a benzothiazole type (so-called thiocyanine type), a pyrylium type, a thiapyrylium type, a squalium type, a croconium type, an azulenium type or a so-called polymethine type wherein noncyclic hetero atoms are connected via polymethine chain. Among them, preferred is a cyanine dye such as a quinoline type, an indole type, a benzothiazole type, a pyrylium type or a thiapyrylium type, or a polymethine type dye.

As the basic structure of the dye in the present invention, among the above cyanine dyes, the quinoline type dye is preferably one represented by the following formula (Ia), (Ib) or (Ic).

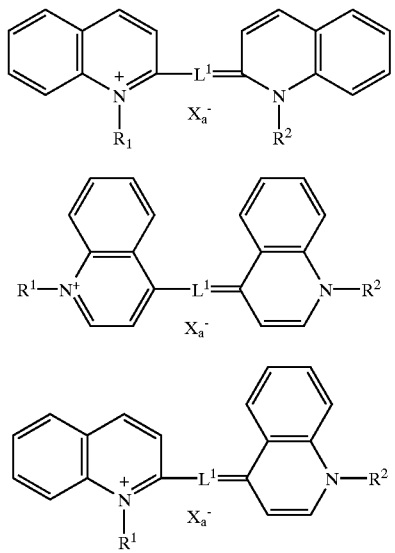

In the formulae (Ia), (Ib) and (Ic), each of $R^1$ and $R^2$ which are independent of each other, is an alkyl group which may have a substituent, an alkenyl group which may have a substituent, an alkynyl group which may have a substituent, or a phenyl group which may have a substituent, $L^1$ is a tri-, penta-, hepta-, nona- or undeca-methine group which may have a substituent, two substituents on the penta-, hepta-, nona- or undeca-methine group, may be connected to each other to form a $C_{5-7}$ cycloalkene ring, cycloalkenone ring, cycloalkendione ring or cycloalkenthione ring, and the quinoline ring may have substituents, and in such a case, adjacent two substituents may be connected to each other to form condensed benzene ring. $X_a^-$ is a counter anion.

Here, in the formulae (Ia), (Ib) and (Ic), when each of $R^1$ and $R^2$ is an alkyl group, the carbon number is usually from 1 to 15, preferably from 1 to 10, and when it is an alkenyl group or an alkynyl group, the carbon number is usually from 2 to 15, preferably 2 to 10. The substituent thereof including the substituent of the phenyl group, may, for example, be an alkoxy group having usually from 1 to 15, preferably from 1 to 10, carbon atoms, a phenoxy group, a hydroxyl group or a phenyl group, and the substituent in $L^1$ may, for example, be an alkyl group having the same carbon number as above, an amino group or a halogen atom, and the substituent on the quinoline ring may, for example, be an alkyl group having the same carbon number as above, an alkoxy group having the same carbon number as above, a nitro group or a halogen atom.

Further, as the basic structure of the dye in the present invention, as the indole type or benzothiazole type dye among the above cyanine dyes, one represented by the following formula (II) is particularly preferred.

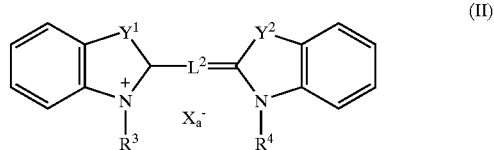

In the formula (II), each of $Y^1$ and $Y^2$ which are independent of each other, is a the alkylmethylene group or a sulfur atom, each of $R^3$ and $R^4$ which are independent of each other, is an alkyl group which may have a substituent, an alkenyl group which may have a substituent, an alkynyl group which may have a substituent, or a phenyl group which may have a substituent, $L^2$ is a tri-, penta-, hepta-, nona- or undeca-methine group which may have substituents, two substituents on the penta-, hepta-, nona- or undeca-methine group, may be connected to each other to form a $C_{5-7}$ cycloalkene ring, cycloalkenone ring, cycloalkendione ring or cycloalkenthione ring, and the condensed benzene ring may have substituents, and in such a case, adjacent two substituents may be connected to each other to form a condensed benzene ring. $X_a^-$ is a counter anion.

In the formula (II), when each of $R^3$ and $R^4$ is an alkyl group, the carbon number is usually from 1 to 15, preferably from 1 to 10, and when it is an alkenyl group or an alkynyl group, the carbon number is usually from 2 to 15, preferably from 2 to 10. The substituent thereof including the substituent of the phenyl group may, for example, be an alkoxy group having usually from 1 to 15, preferably from 1 to 10, carbon number atoms, a phenoxy group, a hydroxyl group or a phenyl group, the substituent in $L^2$ may, for example, be an alkyl group having the same carbon number as above, an amino group or a halogen atom, and the substituent on the condensed benzene ring may, for example, be an alkyl group having the same carbon number as above, an alkoxy group having the same carbon number as above, a nitro group or a halogen atom.

Further, as regards the basic structure of the dye in the present invention, as the pyrylium type or thiapyrylium type dye among the above cyanine dyes, one represented by the following formula (IIIa), (IIIb) or (IIIc) is particularly preferred.

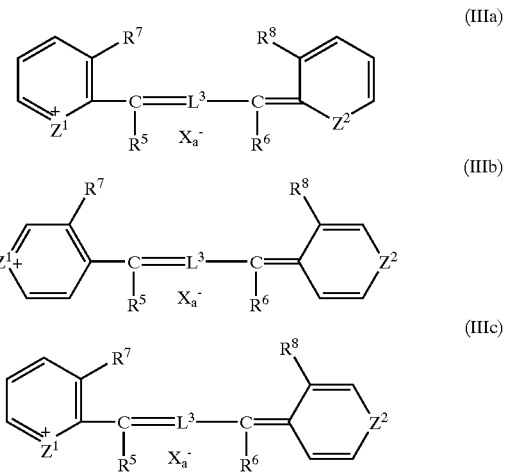

In the formulae (IIIa), (IIIb) and (IIIc), each of $Z^1$ and $Z^2$ which are independent of each other, is an oxygen atom or a sulfur atom, and each of $R^5$, $R^6$, $R^7$ and $R^8$ which are independent of one another, is a hydrogen atom or an alkyl group, or $R^5$ and $R^7$, or $R^6$ and $R^8$, may be connected to each other to form a $C_5$ or $C_6$ cycloalkene ring, $L^3$ is a mono-, tri-, penta- or hepta-methine group which may have substituents, and two substituents on the tri-, penta- or hepta-methine group, may be connected to each other to form a $C_{5-7}$ cycloalkene ring, cycloalkenone ring, cycloalkendione ring or cycloalkenthione ring, and the pyrylium ring and the thiapyrylium ring may have substituents, and in such a case, two adjacent substituents may be connected to each other to form a condensed benzene ring. $X_a^-$ is a counter anion.

Here, in the formulae (IIIa), (IIIb) and (IIIc), when each of $R^5$, $R^6$, $R^7$ and $R^8$ is an alkyl group, the carbon number is usually from 1 to 15, preferably from 1 to 10, and the substituent in $L^3$ may, for example, be an alkyl group having the same carbon number as above, an amino group or a halogen atom, and the substituents on the pyrylium ring and the thiapyrylium ring, may, for example, be aryl groups such as phenyl groups.

Further, as regards the basic structure of the dye in the present invention, as the polymethine type dye among the above cyanine dyes, one represented by the following formula (IV) is particularly preferred.

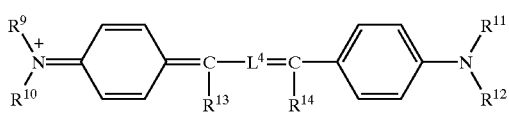

(IV)

In the formula (IV), each of $R^9$, $R^{10}$, $R^{11}$ and $R^{12}$ which are independent of one another, is an alkyl group, and each of $R^{13}$ and $R^{14}$ which are independent of each other, is an aryl group, a furyl group or a thienyl group, which may have a substituent, $L^4$ is a mono-, tri-, penta- or hepta-methine group which may have a substituent, and two substituents on the tri-, penta- or hepta-methine group may be connected to each other to form a $C_{5-7}$ cycloalkene ring, a cycloalkenone ring, a cycloalkendione ring or a cycloalkenthione ring, and the quinone ring and the benzene ring may have substituents. $X_a^-$ is a counter anion.

Here, the carbon number of the alkyl group for $R^9$, $R^{10}$, $R^{11}$ and $R^{12}$ in the formula (IV) is usually from 1 to 15, preferably from 1 to 10, and when each of $R^{13}$ and $R^{14}$ is an aryl group, the carbon number is usually from 6 to 20, preferably from 6 to 15. Specifically, each of $R^{13}$ and $R^{14}$ may, for example, be a phenyl group, a 1-naphtyl group, a 2-naphtyl group, a 2-furyl group, a 3-furyl group, a 2-thienyl group or a 3-thienyl group, and their substituents may, for example, be an alkyl group having the same carbon number as above, an alkoxy group having the same carbon number as above, a dialkylamino group, a hydroxyl group or a halogen atom, the substituent in $L^4$ may, for example, be an alkyl group having the same carbon number as above, an amino group or a halogen atom, and the substituents on the quinone ring and the benzene ring may, for example, be an alkyl group having the same carbon number as above, an alkoxy group having the same carbon number as above, a nitro group or a halogen atom.

The counter anion $X_a^-$ in each of the above formulae (Ia) to (Ic), (II), (IIIa) to (IIIc) and (IV) may specifically be an inorganic acid anion such as $Cl^-$, $Br^-$, $I^-$, $ClO_4^-$, $SbF_6^-$, $AsF_6^-$ or an inorganic boric acid such as $BF_4^-$ or $BCl_4^-$, or an organic acid anion of e.g. benzenesulfonic acid, toluene sulfonic acid, naphthalene sulfonic acid, acetic acid, or an organic boric acid having an organic group such as methyl, ethyl, propyl, butyl, phenyl, methoxyphenyl, naphtyl, fluorophenyl, difluorophenyl, pentafluorophenyl, thienyl or pyrrolyl.

As the basic structure of the dye in the present invention, among cyanine dyes such as a quinoline type of the above formula (Ia) to (Ic), an indole type or a benzothiazole type of the above formula (II) and a pyrylium type or a thiapyrylium type of the above formula (IIIa) to (IIIc), and a polymethine type dye of the above formula (IV), particularly preferred in the present invention is an indole type or benzothiazole type dye of the above formula (II).

Further, as the polymethine chain including $L^1$, $L^2$, $L^3$ or $L^4$ in the above formulae, one having a hepta-methine chain is preferred for a wavelength region of from 700 to 850 nm, one having a nona-methine chain is preferred for a wavelength region of from 850 to 950 nm, and one having an undeca-methine chain is preferred for a wavelength region of from 950 to 1,300 nm.

As the dye of component (B) in the present invention, in the case of a dye (B-1) having, on a polymethine chain of the above basic structure, a substituent containing a chain ether bond which forms an oxonium cation or a chain thioether bond which forms a sulfonium cation, upon resonance in the dye molecule, the resonance mechanism may be as shown by the following formulae, for example, in the case of a dye of a structure wherein nitrogen atoms are connected via a nona-methine chain.

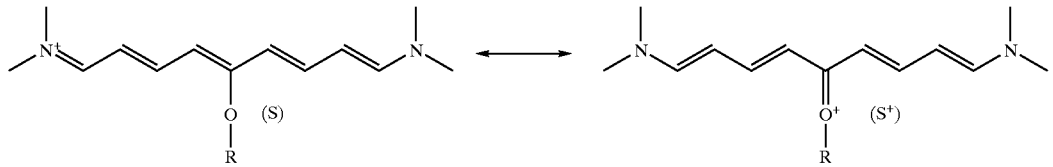

In the present invention, in the case of the dye (B-1), the substituent containing a chain ether bond or a chain thioether bond on the polymethine chain, may specifically be one represented by the following formula (Va), and such a substituent may be connected to the polymethine chain of the dye via another polymethine chain.

(Va)

In the formula (Va), $W^1$ is an oxygen atom or a sulfur atom, and $R^a$ is an alkyl group which may have a substituent, an aryl group which may have a substituent, or a heterocyclic group which may have a substituent.

Here, when $R^a$ in the formula (Va) is an alkyl group, the carbon number is usually from 1 to 15, preferably from 1 to 10; when it is an aryl group, the carbon number is usually from 6 to 20, preferably from 6 to 15; and when it is a heterocyclic group, the carbon number is usually from 2 to 15, preferably from 2 to 10. The substituent thereof may, for example, be a $C_{1-5}$ alkyl group, a $C_{1-5}$ alkoxy or thioalkoxy group, a $C_{2-5}$ acyl group, a $C_{2-5}$ acyloxy group, a $C_{2-5}$ alkoxycarbonyl group, a phenyl group, a naphthyl group, an isocyanate or isothiocyanate group, an oxo or thiooxo group, a $C_{2-5}$ heterocyclic group, a hydroxyl group, or a halogen atom.

Among those represented by the above formula (Va), one wherein $R^a$ is a phenyl group, or one wherein $R^a$ is a heterocyclic ring and represented by the following formula (Vb), is preferred.

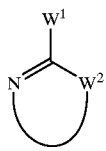

(Vb)

In the formula (Vb), $W^1$ is an oxygen atom or a sulfur atom, $W^2$ is an oxygen atom, a sulfur atom, a nitrogen atom or a dialkylmethylene group, $W^1$ and $W^2$ may be the same or different, and the hetero ring is a 4- to 6-membered ring which may have substituents, whereby adjacent two substituents may be connected to each other to form a condensed ring.

Further, among those represented by the above formula (Vb), one represented by the following formula (Vc), (Vd) or (Ve) is preferred, and one represented by the following formula (Vc) is particularly preferred.

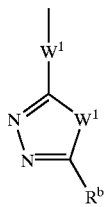

(Vc)

In the formula (Vc), $W^1$ is an oxygen atom or a sulfur atom, the two $W^1$ may be the same or different, and $R^b$ is an alkyl group which may have a substituent, an alkoxy or thioalkoxy group which may have a substituent, an aryl group which may have a substituent, a heterocyclic group which may have a substituent, or a halogen atom.

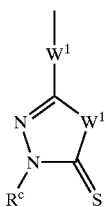

(Vd)

In the formula (Vd), $W^1$ is an oxygen atom or a sulfur atom, the two $W^1$ may be the same or different, and $R^c$ is an alkyl group which may have a substituent, an aryl group which may have a substituent, a heterocyclic group which may have a substituent, or a halogen atom.

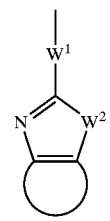

(Ve)

In the formula (Ve), $W^1$ is an oxygen atom or a sulfur atom, $W^2$ is an oxygen atom, a sulfur atom, a nitrogen atom or a dialkylmethylene group, $W^1$ and $W^2$ may be the same or different, and the condensed ring represents an aromatic hydrocarbon ring.

Here, when the formulae (Vc), (Vd) and (Ve), when $R^b$ or $R^c$ is an alkyl group, the carbon number is usually from 1 to 5; when it is an alkoxy group or a thioalkoxy group, the carbon number is usually from 1 to 5; when it is an aryl group, the carbon number is usually from 6 to 10; when it is a heterocyclic group, the carbon number is usually from 2 to 5; and when $W^2$ in the formula (Ve) is a dialkylmethylene group, the carbon number is usually from 3 to 15.

Preferred examples of the foregoing substituent containing a chain ether bond or a chain thioether bond on a polymethine chain, are shown below.

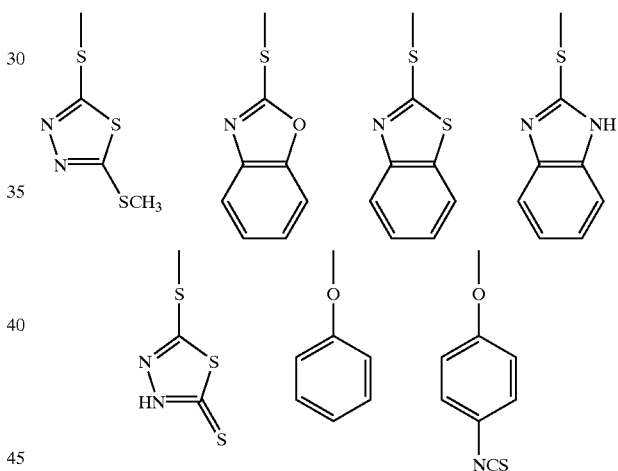

Further, the above dye (B-1) in the present invention may be one taking a cross-linked structure wherein the substituent containing a chain ether bond or a chain thioether bond on a polymethine chain, is connected to a polymethine chain of a dye of the same or different type via another chain ether bond or chain thioether bond, directly or via a further bivalent connecting group.

The above dye (B-1) in the present invention can be synthesized, for example, by a method disclosed by N. Narayanan et al. "Near-Infrared Dyes for High Technology Applications" compiled by S. Daehne, U. R. Genger, O. S. Wolfbeis (published by Kluwer Academic Publishers), specifically, for example, by a reaction of a dye of a structure wherein hetero rings are connected via a polymethine chain having a chlorine atom as a substituent, with a sodium salt compound of a corresponding alcohol or a sodium salt compound of a corresponding thioalcohol.

Specific examples of the dye (B-1) having, as a basic structure, the above-mentioned cyanine dye or the polymethine type dye and having, on the polymethine chain, the above-mentioned substituent containing a chain ether bond which forms an oxonium cation or a chain thioether bond which forms a sulfonium cation, upon resonance in the dye molecule, as the dye of component (B) in the present invention, will be shown below. In the following specific examples, A is a substituent containing a chain ether bond or a chain thioether bond, and $X_a^-$ is a counter anion such as $Cl^-$, $Br^-$, $I^-$, $ClO_4^-$, $PF_6^-$, $BF_4^-$, p-toluene sulfonic acid or 1-naphthalene sulfonic acid.

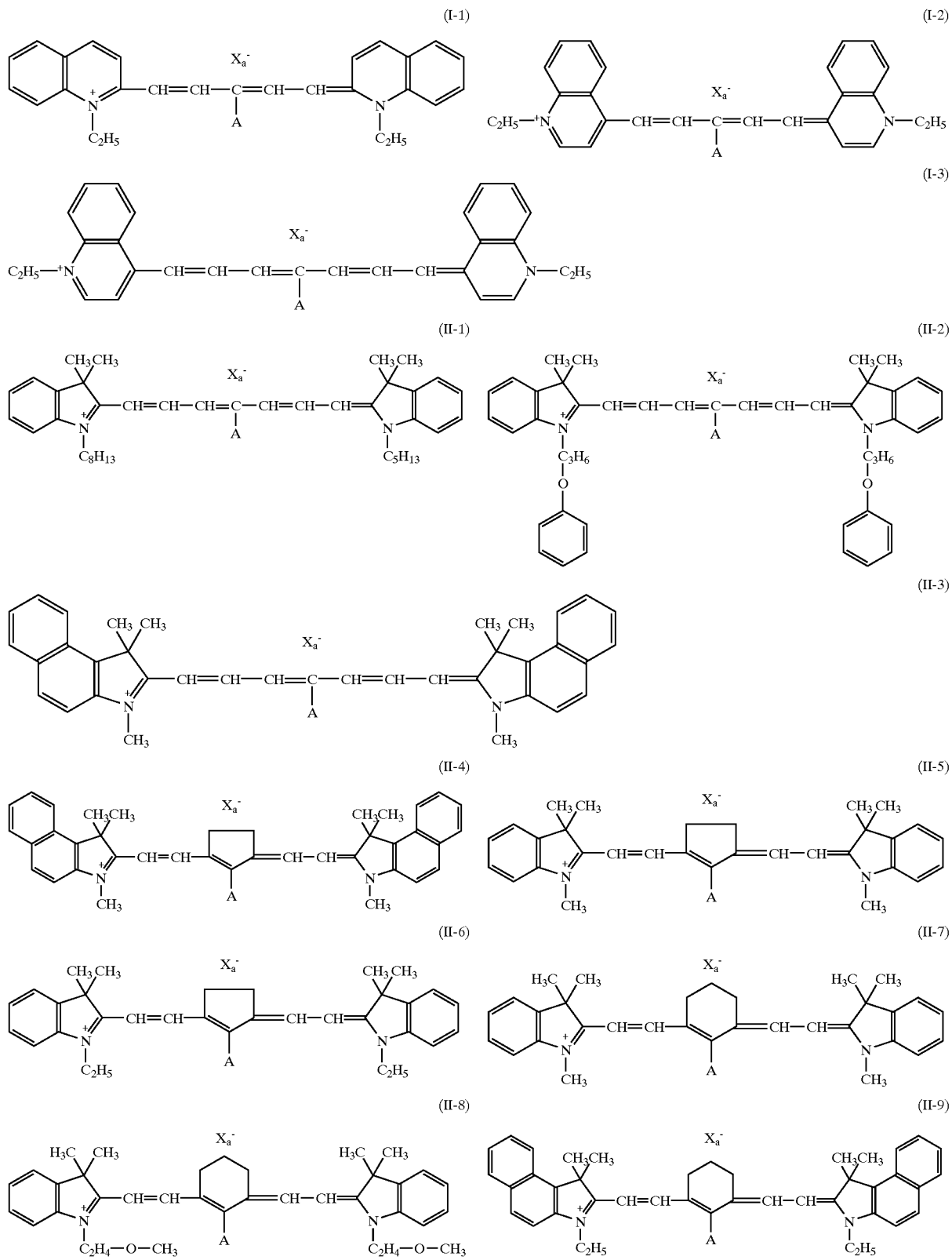

-continued
(II-10)
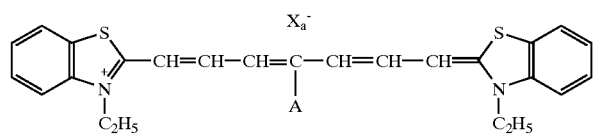
(II-11)
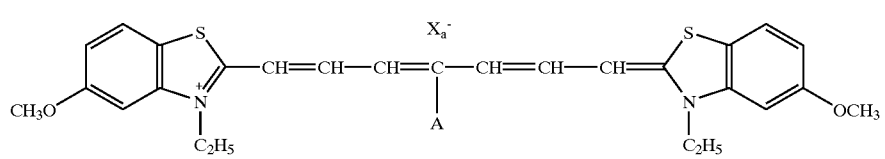
(II-12)
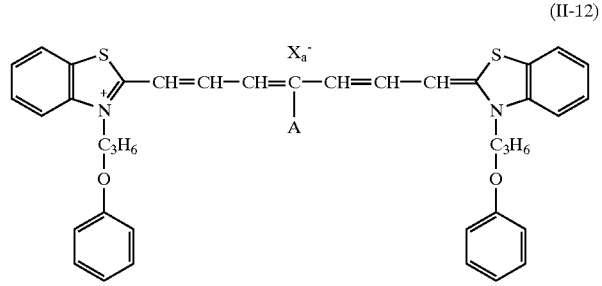
(II-13)
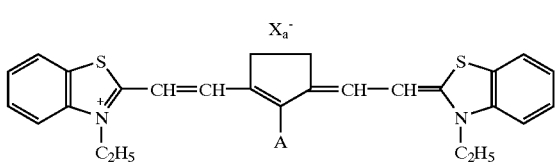
(II-14)
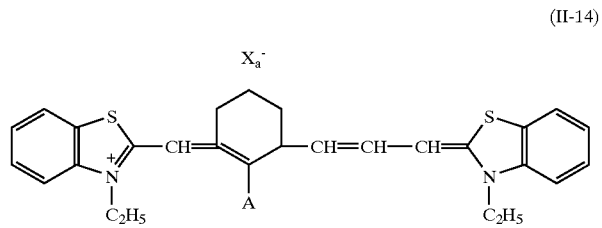
(II-15)
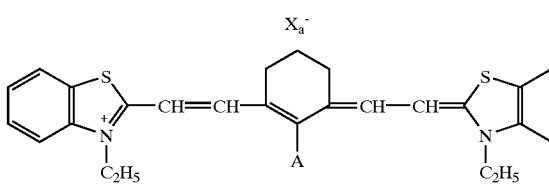
(III-1)
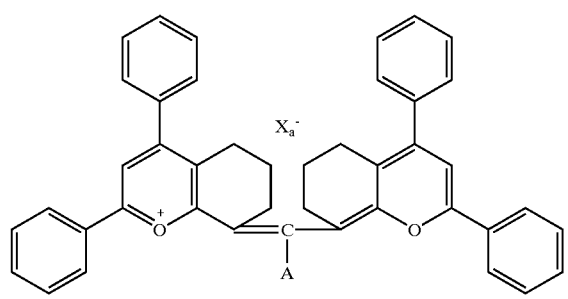
(III-2)
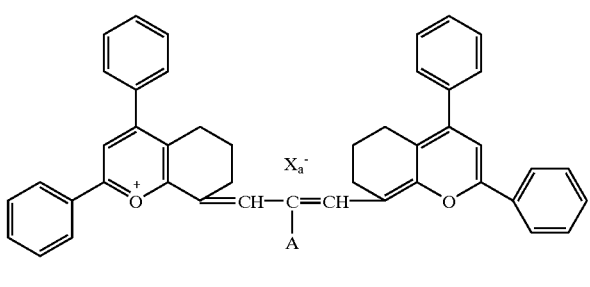
(III-3)
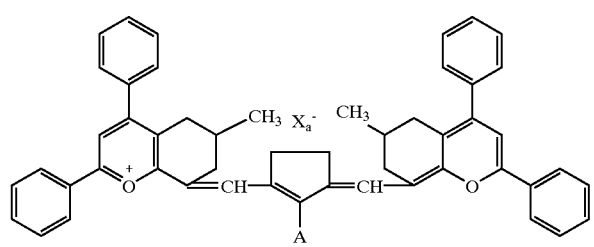
(III-4)
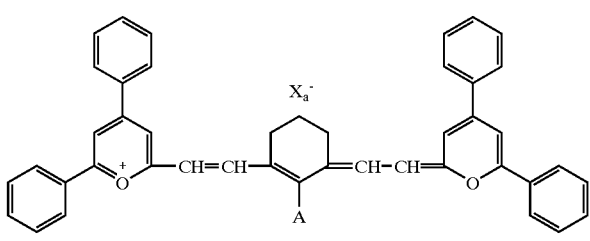

-continued
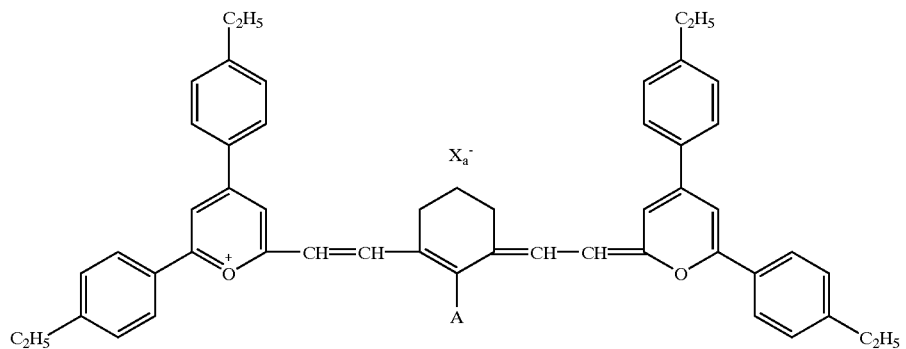
(III-5)
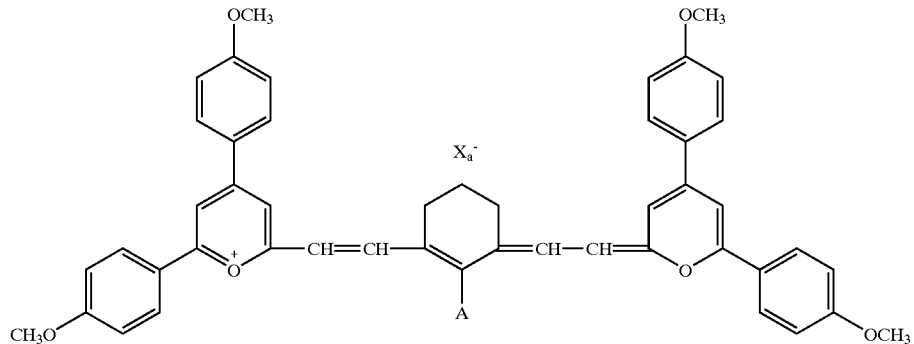
(III-6)
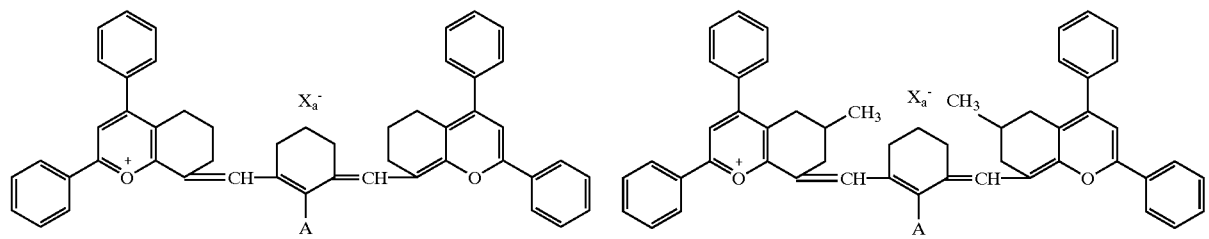
(III-7)   (III-8)
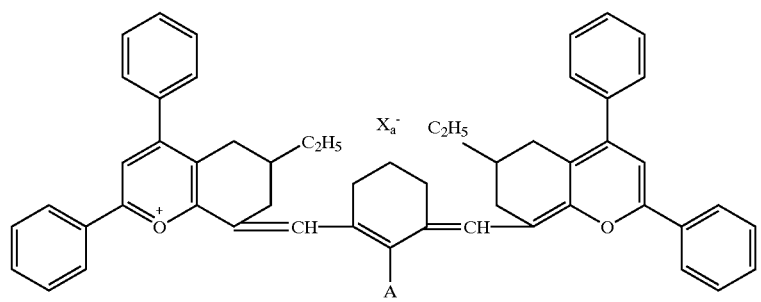
(III-9)
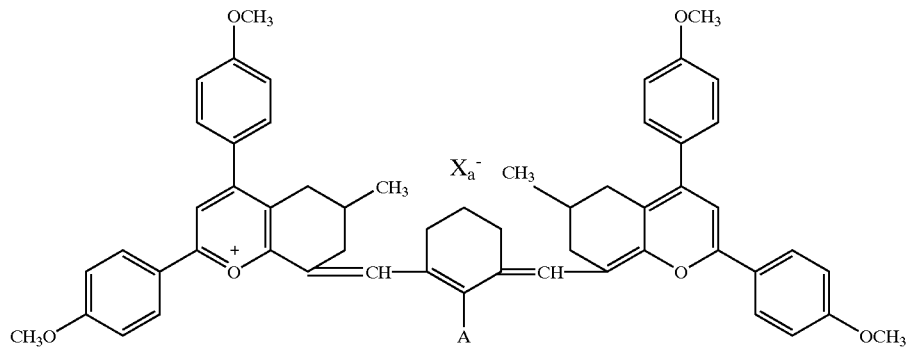
(III-10)

(III-11)
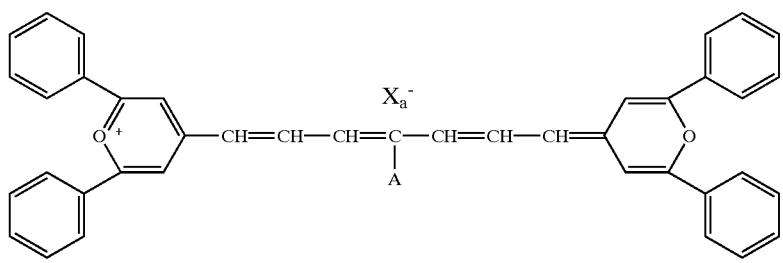
(III-12) (III-13)
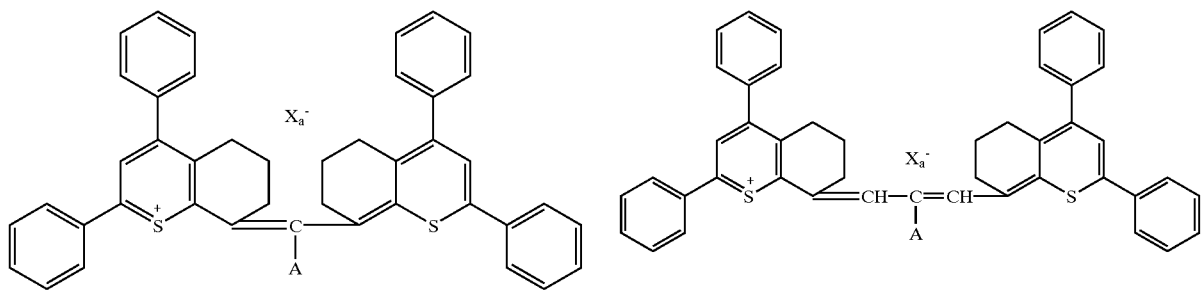
(III-14)
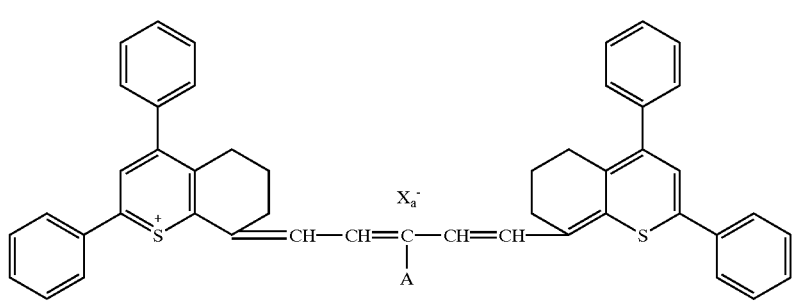
(III-15) (III-16)
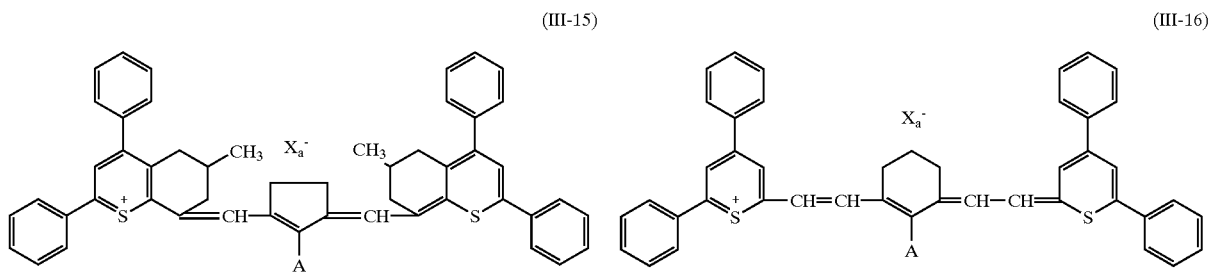
(III-17)
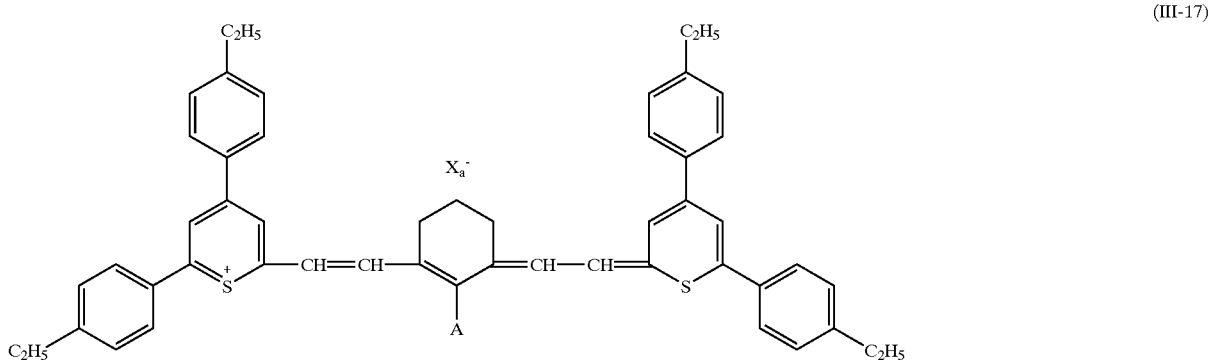

-continued
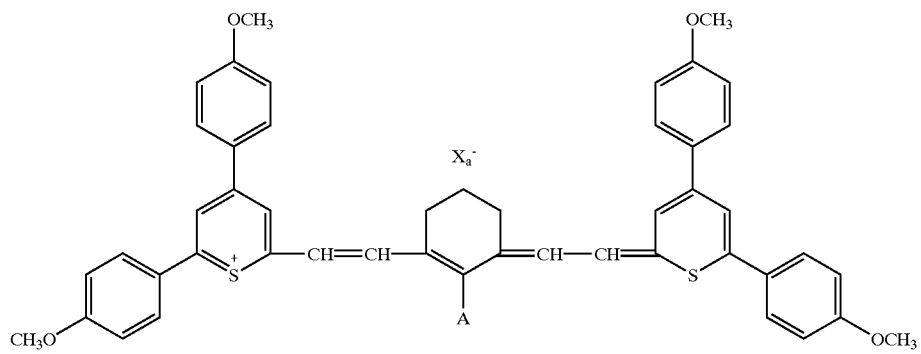
(III-18)
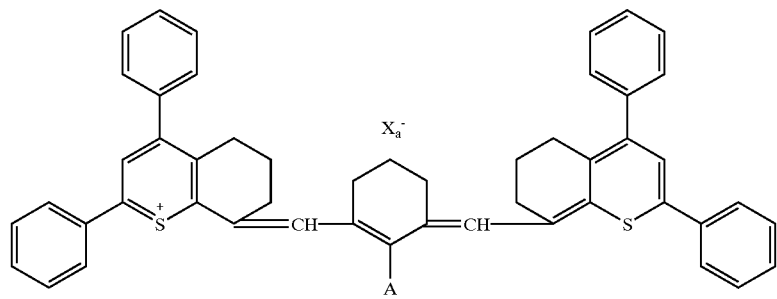
(III-19)
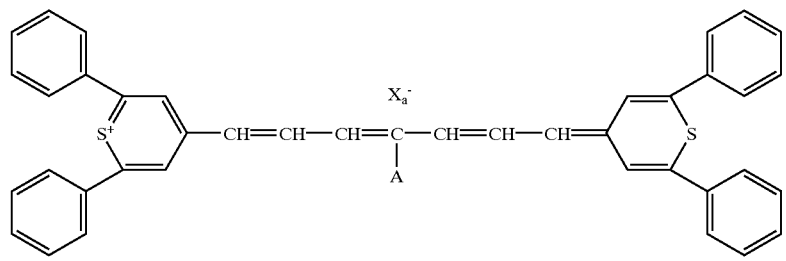
(III-20)
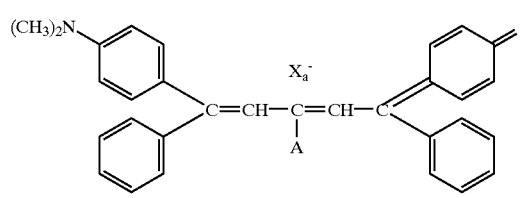
(IV-1)
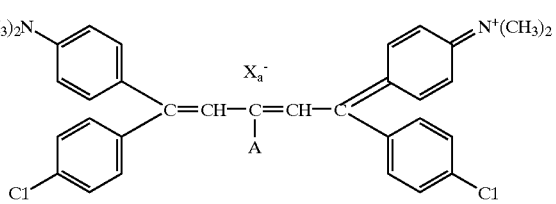
(IV-2)
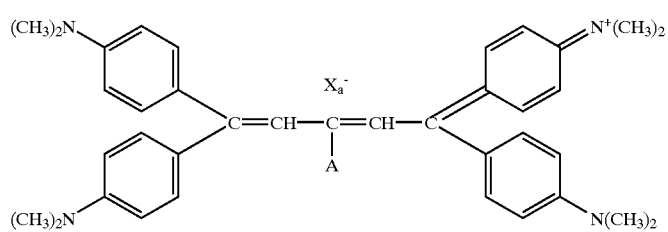
(IV-3)
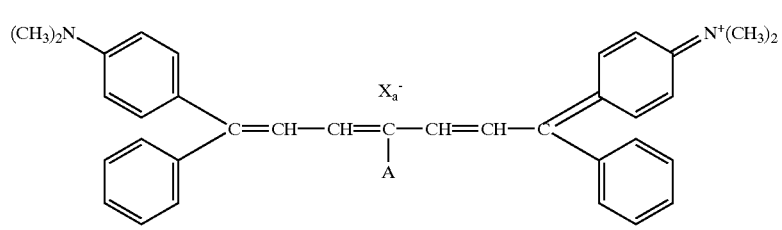
(IV-4)

-continued

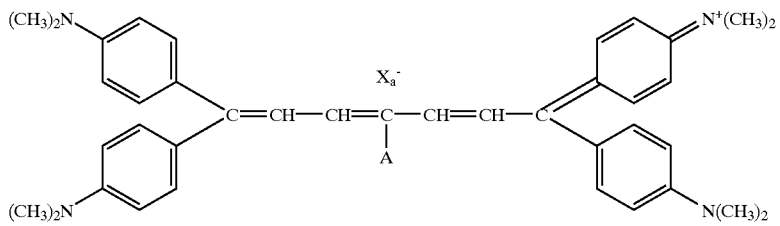

(IV-5)

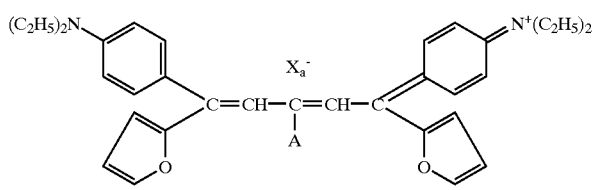

(IV-6)

Further, as the dye of component (B) in the present invention, in the case of the dye (B-2) having, on a polymethine chain of the above-mentioned basic structure, two substituents forming a cyclic ether bond which forms an oxonium cation or a cyclic thioether bond which forms a sulfonium cation, upon resonance in the dye molecule, the resonance mechanism may be as shown by the following formulae, for example, in the case of a dye of a structure wherein nitrogen atoms are connected via a nona-methine chain.

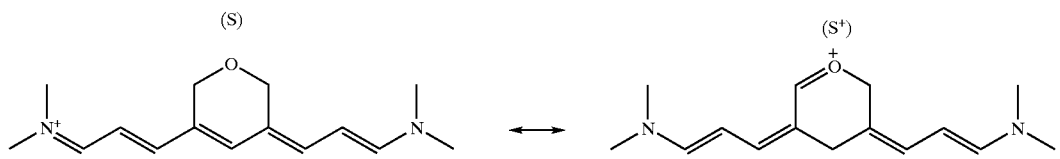

In the present invention, the substituent containing a cyclic ether bond or a cyclic thioether bond on a polymethine chain, may specifically be one represented by the following formula (VIa), having a trimethine group taken in.

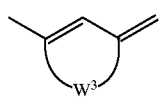

(VIa)

In the formula (VIa), $W^3$ is an oxygen atom or a sulfur atom, and the hetero ring containing $W^3$ is a 5- or 6-membered ring which may have a substituent.

Here, the substituent on the hetero ring in the formula (VIa) may, for example, be a $C_{1-5}$ alkyl group, a $C_{2-5}$ acyloxy group, a $C_{2-5}$ alkoxycarbonyl group, a phenyl group, a naphthyl group, an amino group, a $C_{2-5}$ heterocyclic group, a hydroxyl group, or a halogen atom.

Among those represented by the above formula (VIa), one represented by the following formula (VIb), is preferred.

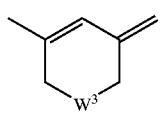

(VIb)

In the formula (VIb), $W^3$ is an oxygen atom or a sulfur atom, and the hetero ring containing $W^3$ may have a substituent.

Here, the substituent on the hetero ring in the formula (VIb) may, for example, be a $C_{1-5}$ alkyl group, a phenyl group, a naphthyl group, an amino group or a halogen atom.

Preferred examples of the foregoing substituent containing a cyclic ether bond or a cyclic thioether bond on a polymethine chain, are shown below.

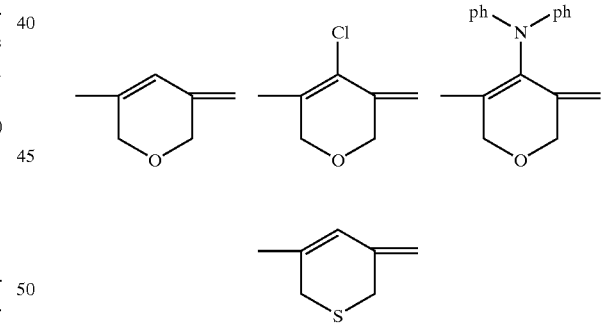

The above dye (B-2) in the present invention can also be synthesized by a method similar to the one mentioned with respect to the above dye (B-1).

Specific examples of the dye (B-2) having, as a basic structure, the above-mentioned cyanine dye or the polymethine type dye and having, on the polymethine chain, two substituents forming a cyclic ether bond which forms an oxonium cation or a cyclic thioether bond which forms a sulfonium cation, upon resonance in the dye molecule, may be those corresponding to (I-1) to (I-3), (II-1) to (II-3), (II-10) to (II-12), (III-2), (III-11), (III-13) to (III-14), (III-20), (IV-1) to (IV-6), wherein the carbon atom having A as a substituent and the trimethine group containing two carbon atoms bonded thereto, are replaced by the above-mentioned formula (VIa).

Further, as the dye of component (B) in the present invention, in the case of the dye (B-3) having, on a polymethine chain of the above-mentioned basic structure, a substituent containing an amino-vinyl bond which forms an aminium cation upon resonance in the dye molecule, the resonance mechanism may be as shown by the following formulae, for example, in the case of a dye of a structure wherein nitrogen atoms are connected via a nona-methine chain.

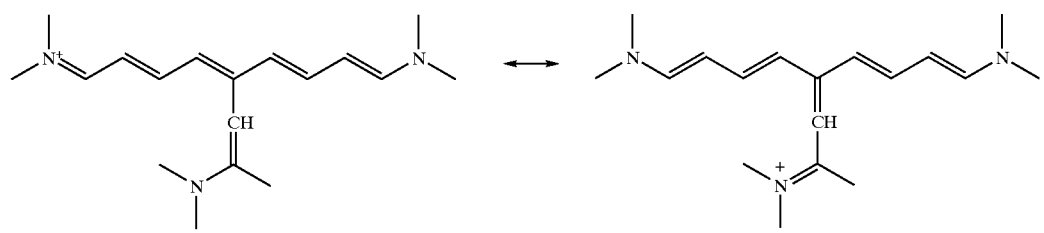

In the present invention, the substituent containing an amino-vinyl bond on a polymethine chain, may specifically be one represented by the following formula (VIIa), and such a substituent may be connected to the polymethine chain of the dye via another polymethine chain.

(VIIa)

In the formula (VIIa), $R^d$ is an amino group which may have a substituent, the vinyl group may have a substituent, and the substituent on the amino group and the substituent on the vinyl group may be connected to each other to form a hetero ring.

Here, the substituent in the amino group and the vinyl group in the formula (VIa) may, for example, be a $C_{1-5}$ alkyl group, a phenyl group, a naphthyl group, a $C_{2-5}$ heterocyclic group or a hydroxyl group.

Among those represented by the above formula (VIIa), one represented by the following formula (VIIb) is preferred.

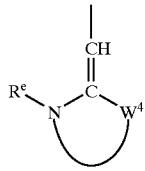

(VIIb)

In the formula (VIIb), $W^4$ is an oxygen atom, a sulfur atom, a nitrogen atom or a dialkylmethylene group, $R^e$ is an alkyl group which may have a substituent, an aryl group which may have a substituent, or a hydrogen atom, and the hetero ring is a 4- to 6-membered ring, and may have substituents, and in such a case, adjacent two substituents may be connected to each other to form a condensed ring.

Further, among those represented by the above formula (VIIb), one represented by the following formula (VIIc) is particularly preferred.

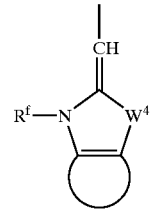

(VIIc)

In the formula (VIIc), $W^4$ is an oxygen atom, a sulfur atom, a nitrogen atom or a dialkylmethylene group, $R^f$ is an alkyl group which may have a substituent or an aryl group which may have a substituent, and the condensed ring represents an aromatic hydrocarbon ring.

Here, $R^f$ in the formulae (VIIb) and (VIIc) is an alkyl group, the carbon number is usually from 1 to 5, and when it is an aryl group, the carbon number is usually from 6 to 10. The substituent thereon and the substituent on the hetero ring may, for example, be a $C_{2-5}$ acyloxy group, a $C_{2-5}$ acyl group, a $C_{2-5}$ acyloxy group, a $C_{2-5}$ acyloxycarbonyl group, a phenyl group or a naphthyl group. When $W^4$ in the formula (VIIc) is a dialkylmethylene group, the carbon number is usually from 3 to 15.

Preferred examples of the foregoing substituent containing an amino-vinyl bond on a polymethine chain, will be shown below.

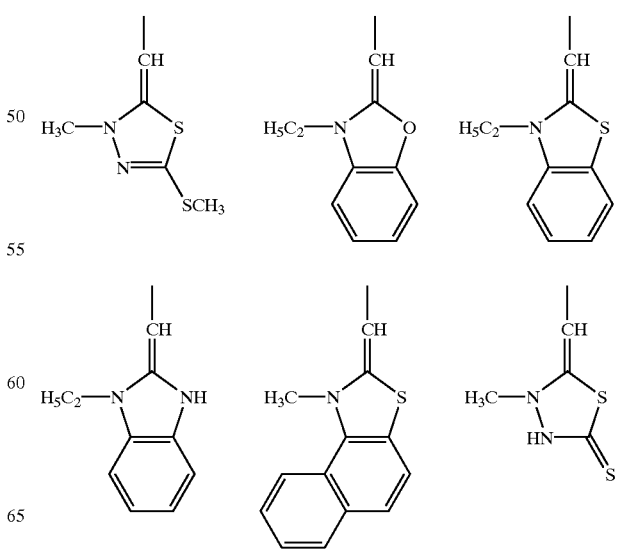

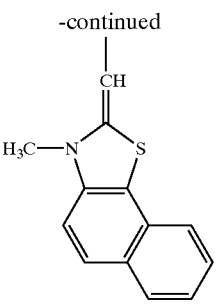

The above dye (B-3) in the present invention can be synthesized, for example, by a method disclosed by Slominskii, Yu. L. et al., Inst.Org.Khim., Kiev, USSR.J.Inf.Rec.Mater, 16, 23(1988), specifically, for example, by a reaction of a dye of a structure wherein hetero rings are connected via a polymethine chain having a chlorine atom as a substituent, with a corresponding compound such as a 2-methylthiazonate salt having active hydrogen.

Specific examples of the dye (B-3) having, as a basic structure, the above-mentioned cyanine dye or a polymethine type dye and having, on its polymethine chain, a substituent containing an amino-vinyl bond which forms an aminium cation under resonance in the dye molecule, may be those corresponding to the specific examples mentioned for the above dye (B-1) wherein A as the substituent is replaced by the above formula (VIIa).

Further, as the dye of component (B) in the present invention, in the case of the dye (B-4) having, on the polymethine chain of the above basic structure or on other basic structure, a substituent containing an acid anion group or its ester group, or a base, such an acid anion group or its ester group, or the base, may specifically be, for example, a monovalent anion group of e.g. sulfonic acid, carboxylic acid, phosphoric acid or boric acid, preferably sulfonic acid, carboxylic acid or phosphoric acid, more preferably sulfonic acid, or a $C_{1-4}$ alkylester group thereof, or a base of an alkali metal such as sodium.

Further, the substituent containing the above anion group or its ester group, or the base, may specifically be, for example, one having a structure wherein such an anion group or its ester, or the base is connected directly to the above basic structure, or one which has the above anion group or its ester, or the base, at the terminal and having a structure wherein such a terminal group and the above basic structure are connected by a connecting group such as a $C_{1-10}$ alkylene group which may have a substituent, a $C_{1-15}$ alkyleneoxy group which may have a substituent, a $C_{2-15}$ polyalkyleneoxy group which may have a substituent, a $C_{2-15}$ alkylenesulfinyl group which may have a substituent, a phenylene group which may have a substituent, a phenyleneoxy group which may have a substituent or a phenylenesulfinyl group which may have a substituent. Further, the substituent thereon may, for example, be an alkyl group, an aryl group, an acyl group, a hydroxyl group or a halogen atom.

Among them, in the present invention, one having a structure connected directly to the above basic structure, and one having a structure connected by a $C_{1-10}$ alkylene group which may have a substituent, a $C_{1-10}$ alkyleneoxy group which may have a substituent, a $C_{2-10}$ polyalkyleneoxy group which may have a substituent, a phenylene group which may have a substituent or a phenyleneoxy group which may have a substituent, are preferred. Particularly preferred is one having a structure connected directly to the basic structure, or one having a structure connected by a $C_{1-5}$ alkylene group which may have a substituent or a $C_{1-5}$ alkyleneoxy group which may have a substituent.

Preferred examples of the above substituent containing an acid anion group or its ester group, or a base, on a polymethine chain or on other basic structure, will be shown below.

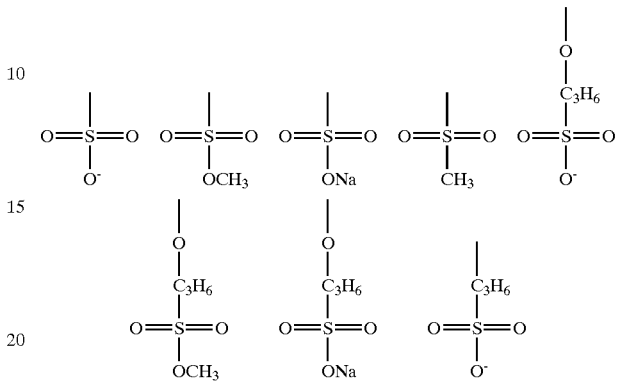

Specific examples of the dye (B-4) having, as a basic structure, the above cyanine dye or the polymethine type dye and having, on the polymethine chain or on other basic structure, a substituent containing an acid anion group or its ester, or a base, as the dye of component (B) in the present invention, may be those corresponding to (I-1) to (I-3), (II-1) to (II-2), (II-5) to (II-8), and (II-10) to (II-15) wherein A as a substituent on the polymethine chain or/and the condensed benzene ring, is the above acid anion group or its ester group, or the base, and (II-3) to (II-4), (II-9), (III-1) to (III-20), and (IV-1) to (IV-6), wherein A as a substituent on a polymethine chain is the above anion group or its ester group, or the base, in the specific examples mentioned with respect to the above dye (B-1). Such an acid anion group or its ester group, or a base, may be present in a plurality, and in such a case, the plurality may be different from one another. However, as the acid anion group, the number is at most one, and the counter anion $X_a^-$ is not present when the acid anion group is one, and it is present in other cases.

The polymerization initiator of component (C) constituting the photopolymerizable composition of the present invention is a radical-forming agent which forms active radicals when irradiated with light in the coexistence of the above-mentioned dye of component (B), and it may, for example, be a halogenated hydrocarbon derivative, an organic borate disclosed, for example, in JP-A-62-143044, JP-A-62-150242, JP-A-9-188685, JP-9-188686, JP-A-9-188710, JP2764769 and Kunz, Martin "Rad Tech '98.Proceeding Apr. 19–22, 1998, Chicago", a titanothene compound disclosed in JP-A-59-152396 or JP-A-61-151197, a hexaarylbiimidazole compound disclosed in JP-A-6-29285, a diaryl iodonium salt and an organic peroxide. In the present invention, a halogenated hydrocarbon derivative and an organic borate are preferred.

Here, the halogenated hydrocarbon derivative is preferably a s-triazine derivative having at least one mono-, di- or tri-halogenated methyl group bonded to a s-triazine ring, such as 2,4,6-tris(monochloromethyl)-s-triazine, 2,4,6-tris (dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α, α, β-trichloroethyl)-4,6-bis(trichloromethyl)-s-triazine, 2-phenyl-4,6-bis(trichloromethyl)-s-triazine, 2-(p-methoxyphenyl)-4,6-bis (trichloromethyl) —triazine, 2-(3, 4-epoxyphenyl)-4,6-bis(trichloromethyl)-s-triazine, 2-(p- chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis (trichloromethyl)-s-triazine, 2-(p-i-propyloxystyryl)-4,6-bis(trichloromethyl)-s-triazine, 2-(p-tryl)-4,6-bis(trichloromethyl)-s-triazine, 2-(4-methoxynaphtyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris (dibromomethyl)-s-triazine, 2,4,6-tris(tribromomethyl)-s-triazine, 2-methyl-4,6-bis(tribromomethyl)-s-triazine, or 2-methoxy-4,6-bis (tribromomethyl)-s-triazine. Among them, a bis(trihalomethyl)-s-triazine compound such as 2-methyl-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis (trichloromethyl)-s-triazine, 2-[1-(p-methoxyphenyl)-2,4-butadienyl]-4,6-bis(trichloromethyl)-s-triazine, 2-(p-methoxystyryl)-4,6-bis(trichloromethyl)-s-triazine or 2-(p-i-propyloxystyryl)-4,6-bis(trichloromethyl)-s-triazine, is particularly preferred as it is excellent in stability with time.

Other halogenated hydrocarbon derivatives may, for example, be those disclosed in JP-A-53-133428, JP-A-62-58241, German Patent No. 3,337,024, and M. P. Hutt, E. F. Flslager, L. M. Werbel, Journal of Heterocyclic Chemistry, Vol. 7, No. 3 (1970).

Further, as the organic borate, one represented by the following formula (VIII) is particularly preferred.

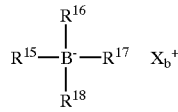

$$R^{15}-\overset{\overset{R^{16}}{|}}{\underset{\underset{R^{18}}{|}}{B^-}}-R^{17} \quad X_b^+ \qquad (VIII)$$

In the formula (VIII), each of $R^{15}$, $R^{16}$, $R^{17}$ and $R^{18}$, which are independent of one another, is an alkyl group which may have a substituent, an alkenyl group which may have a substituent, an alkynyl group which may have a substituent, an aryl group which may have a substituent or a heterocyclic group, and they may be connected to one another to form a cyclic structure, and at least one of them is an alkyl group which may have a substituent. $X_b^+$ is a counter cation.

Here, when each of $R^{15}$, $R^{16}$, $R^{17}$ and $R^{18}$ in the formula (VIII) is an alkyl group, the carbon number is usually from 1 to 15, preferably from 1 to 5, when it is an alkenyl group or an alkynyl group, the carbon number is usually from 2 to 15, preferably from 2 to 5, when it is an aryl group, the carbon number is usually from 6 to 20, preferably from 6 to 15, and when it is a heterocyclic group, the carbon number is from 4 to 20, preferably from 4 to 15. The substituent thereof may, for example, be a halogen atom, an alkyl group, an alkoxy group, a trifluoromethyl group or a trimethylsilyl group.

The organic boron anion of such an organic borate of the formula (VIII) may specifically be, for example, a n-butyl-methyl-diphenyl boron anion, a n-butyl-triphenyl boron anion, a n-butyl-tris(2,4,6-trimethylphenyl)boron anion, a n-butyl-tris(p-methoxyphenyl) boron anion, a n-butyl-tris(p-fluorophenyl) boron anion, a n-butyl-tris(m-fluorophenyl) boron anion, a n-butyl-tris(3-fluoro-4-methylphenyl) boron anion, a n-butyl-tris(2,6-difluorophenyl) boron anion, a n-butyl-tris(2,4,6-trifluorophenyl) boron anion, a n-butyl-tris(2,3,4,5,6-pentafluorophenyl) boron anion, a n-butyl-tris (p-chlorophenyl) boron anion, a n-butyl-tris (trifluoromethyl) boron anion or a n-butyl-tris(2,6-difluoro-3-pyrrolylphenyl) boron anion.

Further, the counter cation $X_b^+$ may, for example, be an alkali metal cation, an ammonium cation, an onium compound such as a phosphonium cation, a sulfonium cation or on iodonium cation, and a pyrylium cation, a thiapyrylium cation or an indolium cation. However, an organic ammonium cation such as a tetraalkyl ammonium is preferred.

To incorporate the dye of component (B) and the organic borate as the polymerization initiator of component (C) in the photopolymerizable composition in the present invention, it is possible to adopt a usual method wherein a salt of a dye cation of the above dye with a optionally selected counter anion and a salt of the organic boron anion of the above organic borate with an optionally selected counter cation, are incorporated, or a method wherein a salt formed by the dye cation of the above dye and the organic boron anion of the above organic borate, is incorporated. In the present invention, the latter method is preferred.

The photopolymerizable composition of the present invention comprises the above ethylenically unsaturated compound of component (A), the above dye of component (B) and the above photopolymerizable initiator of component (C). The proportion of component (A) in the entire photopolymerizable composition is preferably from 20 to 80 wt %, more preferably from 30 to 70 wt %, in view of the contents of other components which will be described hereinafter. Further, the total amount of components (B) and (C) is preferably from 0.1 to 30 parts by weight, more preferably from 0.5 to 20 parts by weight, per 100 parts by weight of component (A).

And, the ratio of the component (B) to component (C) is preferably such that the weight ratio of (B):(C) is within a range of from 1:20 to 10:1, more preferably within a range of from 1:8 to 4:1. Further, in a case where a salt formed by the dye cation in component (B) and the organic boron anion in component (C), is used as mentioned above, the total amount of component (B) and component (C) is preferably from 0.1 to 30 parts by weight, more preferably from 0.5 to 20 parts by weight, per 100 parts by weight of component (A).

The photopolymerizable composition of the present invention preferably contains, in addition to the above described components, a homopolymer or a copolymer of e.g. (meth)acrylic acid, a (meth)acrylate, (meth)acrylonitrile, (meth)acryloamide, maleic acid, styrene, vinyl acetate, vinyl chloride or maleimide, or an organic polymer substance such as a polyamide, a polyester, a polyether, a polyurethane, a polyvinylbutyral, a polyvinylpyrrolidone, a polyethyleneoxide or an acetyl cellulose, as a binder, in an amount within a range of from 10 to 500 parts by weight, particularly from 20 to 200 parts by weight, per 100 parts by weight of the ethylenically unsaturated compound of component (A).

Further, various additives may be incorporated, as the case requires, for example, a thermal polymerization-preventing agent such as hydroquinone, p-methoxyphenol or 2,6-di-t-butyl-p-cresol, in an amount of at most 2 parts by weight, a colorant made of an organic or inorganic dye or pigment, in an amount of at most 50 parts by weight, a plasticizer such as dioctyl phthalate, didodecyl phthalate, tricresyl phosphate, dioctyl adipate or triethylene glycol dicaprylate, in an amount of at most 40 parts by weight, a sensitivity-improver such as a tertiary amine or thiol in an amount of at most 5 parts by weight, and a colorant precursor such as a triaryl methane, a bisaryl methane, a xanthene compound, a fluoran compound, a thiazine compound or a colorant leuco compound such as a compound having a lactone, lactam, sultone or spiropyran structure formed as its partial structure, in an amount of at most 10 parts by weight.

When the photopolymerizable composition of the present invention is used as a photosensitive material, it may take a suitable mode of application depending upon the particular purpose, for example, a mode such that it is coated on a support surface in the absence of a solvent or after diluted with a suitable solvent, and dried, or a mode such that an overcoating layer for shielding oxygen is further formed thereon, or a mode such that it is dispersed in small droplets in different phase media and coated in the form of multi layers as a plurality of photosensitive materials, or a mode such that it is coated on a support as encapsulated in microcapsules. The polymerizable composition of the present invention is preferably used in the form of a photopolymerizable lithographic printing plate prepared in such a manner that the composition is coated on a support surface in the form of a solution having the composition dissolved in a suitable solvent, followed by heating and drying to form a layer of the photopolymerizable composition of the present invention on the support surface.

Here, the solvent is not particularly limited so long as it provides sufficient solubility for the components used and it provides a good film-forming property. It may, for example, be a cellosolve type solvent such as methyl cellosolve, ethyl cellosolve, methyl cellosolve acetate or ethyl cellosolve acetate, a propylene glycol type solvent such as propylene glycol monomethyl ether, propylene glycol monoethyl ether, propylene glycol monobutyl ether, propylene glycol monomethyl ether acetate, propylene glycol monoethyl ether acetate, propylene glycol monobutyl ether acetate or dipropylene glycol dimethyl ether, an ester type solvent such as butyl acetate, amyl acetate, ethyl lactate, butyl lactate, diethyl oxalate, ethyl pyruvate, ethyl 2-hydroxy butyrate, ethyl acetate, methyl lactate, ethyl lactate or methyl 3-methoxy propionate, an alcohol type solvent such as heptanol, hexanol, diacetone alcohol or furfuryl alcohol, a ketone type solvent such as cyclohexanone or methyl amyl ketone, a highly polar solvent such as dimethylformamide, dimethylacetoamide or N-methylpyrrolidone, or a mixed solvent thereof. Further, one having an aromatic hydrocarbon added thereto, may be mentioned. The amount of the solvent is usually within a range of from 1 to 20 times by weight, based on the total amount of the photopolymerizable composition.

As the coating method, a conventional method such as rotation coating, wire bar coating, dip coating, air knife coating, roll coating, blade coating or curtain coating, may be employed. The amount of coating varies depending upon the particular purpose, but it is usually within a range of from 0.3 to 7 $\mu$m, preferably from 0.5 to 5 $\mu$m, more preferably from 1 to 3 $\mu$m, as a dried film thickness. The drying temperature at that time is, for example, at a level of from 60 to 170° C., preferably from 70 to 150° C., and the drying time is usually from 5 seconds to 10 minutes, preferably from 10 seconds to 5 minutes.

Further, it is common to provide an oxygen-shielding layer of e.g. polyvinylalcohol, polyvinylpyrrolidone, polyethyleneoxide or cellulose, on the above layer of the photopolymerizable composition, in order to prevent the polymerization inhibiting action by oxygen.

As the support, a metal plate of e.g. aluminum, zinc, copper or steel, a metal plate having aluminum, zinc, copper, iron, chromium or nickel plated or vapor-deposited thereon, a paper sheet, a paper sheet coated with a resin, a paper sheet having a metal foil such as an aluminum foil bonded thereto, a plastic film, a plastic film treated by hydrophilic treatment, or a glass plate, may, for example, be mentioned. Among them, preferred is an aluminum plate, and more preferred is an aluminum plate subjected to graining treatment by blush polishing or electrolytic etching in a hydrochloric acid or nitric acid solution, anodic oxidation treatment in a sulfuric acid solution and, if necessary, surface treatment such as sealing treatment. Further, the surface roughness of the support is usually from 0.3 to 1.0 $\mu$m, preferably from 0.4 to 0.8 $\mu$m, as average roughness $R_a$ as stipulated by JIS B0601.

A light source for image exposure of the photopolymerizable composition layer of the lithographic printing plate of the present invention, may, for example, be a carbon arc, a high pressure mercury lamp, a xenon lamp, a metal halide lamp, a fluorescent lamp, a tungsten lamp, a halogen lamp, or a laser light source such as a HeNe laser, an argon ion laser, a YAG laser, a HeCd laser, a semiconductor laser, or a ruby laser. Particularly preferred is a light source which is capable of generating a laser beam ranging from a visible light ray of at least 600 nm to a near infrared ray, and a solid laser such as a ruby laser, a YAG laser or a semiconductor laser, may be mentioned. Especially, a semiconductor laser or a YAG laser of a small size having a long useful life, is preferred. By such a light source, scanning exposure is usually conducted, followed by development with a developer, whereby an image will be formed.

When exposed with a high density light intensity of at least $10^8$ W/m$^2$ within a range of a near infrared region of from 700 to 1,300 nm, by means of e.g. a semiconductor laser, the photopolymerizable composition of the present invention shows a sensitivity of at lest 5 times, preferably at least 10 times, as compared with a case where it is exposed with a low density light intensity of at most $10^2$ W/m$^2$, and due to the difference in this sensitivity, it is capable of providing a safe light property (a workability) under a usual white fluorescent lamp.

As the developer to be used for developing after the image exposure of the above photopolymerizable lithographic printing plate of the present invention, an alkali developer is employed which is made of an aqueous solution containing from about 0.1 to 5 wt % of an inorganic alkali salt such as sodium silicate, potassium silicate, lithium silicate, ammonium silicate, sodium methasilicate, potassium methasilicate, sodium hydroxide, potassium hydroxide, lithium hydroxide, sodium carbonate, sodium hydrogencarbonate, potassium carbonate, sodium secondary phosphate, sodium tertiary phosphate, ammonium secondary phosphate, ammonium tertiary phosphate, sodium borate, potassium borate or ammonium borate, or an organic amine compound such as monomethyl amine, dimethyl amine, trimethyl amine, monoethyl amine, diethyl amine, triethyl amine, monoisopropyl amine, diisopropyl amine, monobutyl amine, monoethanol amine, diethanol amine, triethanol amine, monoisopropanol amine or diisopropanol amine. Among them, as an inorganic alkali salt, an alkali metal silicate such as sodium silicate or potassium silicate, is preferred.

Now, the present invention will be described in further detail with reference to Examples. However, it should be understood that the present invention is by no means restricted to such specific Examples.

EXAMPLE 1

An aluminum plate (thickness: 0.24 mm) subjected to graining treatment and anodic oxidation treatment, was used as a support, and on the surface of the aluminum plate support, a coating solution prepared by stirring 100 parts by weight of trimethylolpropane triacrylate as component (A), 5 parts by weight of a cyanine dye (B-1) of the following formula, as component (B), 5 parts by weight of 2-(p-methoxyphenyl)-4,6-bis(trichloromethyl)-s-triazine as component (C), and 100 parts by weight of a methyl methacrylate/methyl acrylate/methacrylic acid copolymer (molar ratio: 90/20/10, weight average molecular weight: 50,000) as a polymer binder, in 1,400 parts by weight of methyl cellosolve at room temperature for 10 minutes, was coated by means of a wire bar and dried at 80° C. for 2 minutes, to form a layer of the photopolymerizable composition having a thickness of 2 μm. Further, an aqueous polyvinyl alcohol solution was coated thereon and dried at 80° C. for 2 minutes, to form an overcoating layer having a thickness of 3 μm, to obtain a photopolymerizable lithographic printing plate.

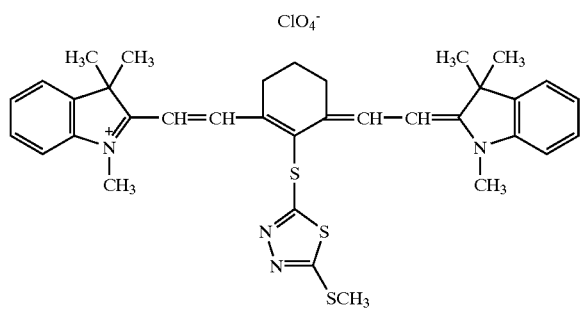

The obtained photopolymerizable lithographic printing plate was secured on an aluminum rotary drum having a diameter of 7 cm so that the layer of the photopolymerizable composition was located outside, and then subjected to scanning exposure at various rotational speeds of from 500 to 1,000 rpm, using a beam spot having a beam of semiconductor laser (manufactured by Applied Techno Company) of 30 mW with 830 nm focussed to 20 μm. Then, development was carried out by means of an alkali developer (negative developer "SDN-21" manufactured by Konica Company, as diluted 8 times), to form a scanning line image. The higher the maximum rotational speed of the exposure drum on which the line image was formed, the higher the sensitivity. In this Example, the maximum rotational speed was 700 rpm.

On the other hand, a lithographic printing plate left to stand under a white fluorescent lamp with a light intensity 400 lux (36 W white fluorescent lamp "Neolumisuper FLR40S-W/M/36", manufactured by Mitsubishi Electric Company Ltd.) for 10 minutes and a lithographic printing plate which was not so left to stand, were subjected to developing treatment in the same manner as above, and then, inking was carried out by means of a developing ink ("PI-2", manufactured by Fuji Photographic Film Industries Company Ltd.), whereby no attachment of the ink was observed irrespective of being left to stand or not being left to stand, whereby it was confirmed that there was no difference in the decrease of solubility of the photopolymerizable composition layer due to the white fluorescent lamp.

EXAMPLE 2

A photopolymerizable lithographic printing plate was prepared and developed in the same manner as in Example 1 except that as component (C), 2-(p-i-propyloxystyryl)-4,6-bis(trichloromethyl)-s-triazine was used, whereby the maximum rotational speed of the exposure drum was 700 rpm.

EXAMPLE 3

A photopolymerizable lithographic printing plate was prepared and developed in the same manner as in Example 1 except that as component (C), an organic borate of a salt of a n-butyl-triphenyl boron anion with a tetra n-butyl ammonium cation, was used, whereby the maximum rotational speed of the exposure drum was 800 rpm.

EXAMPLE 4

A photopolymerizable lithographic printing plate was prepared and developed in the same manner as in Example 1 except that as component (B), a cyanine dye (b-1) of the following formula was used, whereby the maximum rotational speed of the exposure drum was 600 rpm.

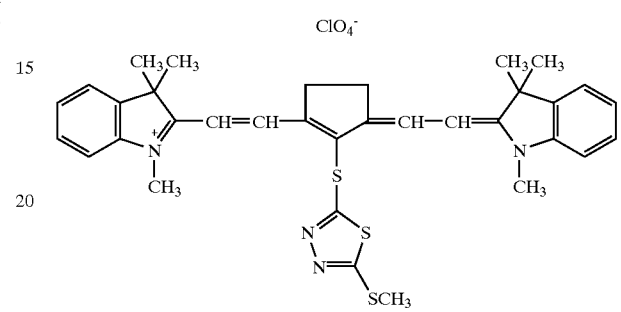

COMPARATIVE EXAMPLE 1

A photopolymerizable lithographic printing plate was prepared and developed in the same manner as in Example 1 except that as component (B), a cyanine dye which does not have a substituent containing a chain thioether bond on the polymethine chain in the cyanine dye (B-1) used in Example 1, was used alone, whereby the maximum rotational speed of the exposure drum was not higher than 400 rpm. In the photopolymerizable composition layer, coating defects due to crystal particles of the cyanine dye, were observed.

COMPARATIVE EXAMPLE 2

A photopolymerizable lithographic printing plate was prepared and developed in the same manner as in Example 1 except that as component (B), a cyanine dye which does not have a substituent containing a chain thioether bond on the polymethine chain in the cyanine dye (B-1) used in Example 4, was used alone, whereby the maximum rotational speed of the exposure drum was not higher than 400 rpm. In the photopolymerizable composition layer, coating defects due to crystal particles of the cyanine dye, were observed.

EXAMPLE 5

An aluminum plate (thickness: 0.24 mm) subjected to graining treatment and anodic oxidation treatment, was used as a support, and on the surface of the aluminum plate support, a coating solution prepared by stirring 100 parts by weight of trimethylolpropane triacrylate as component (A), 5 parts by weight of a cyanine dye (B-2) of the following formula, as component (B), 5 parts by weight of 2-(p-methoxyphenyl)-4,6-bis(trichloromethyl)-s-triazine as component (C), and 100 parts by weight of a methyl methacrylate/methylacrylate/methacrylic acid copolymer (molar ratio: 90/20/10, weight average molecular weight: 50,000) as a polymer binder, in 700 parts by weight of methyl cellosolve and 700 parts by weight of cyclohexanone at room temperature for 10 minutes, was coated by means of a wire bar and dried at 80° C. for 2 minutes, to form a layer of the photopolymerizable composition having a thickness of 2 μm. Further, an aqueous solution of a mixture of polyvinyl alcohol/polyvinylpyrrolidone (weight ratio of 90/10) was coated thereon and dried at 80° C. for 2 minutes, to form an overcoating layer having a thickness of 3 μm, to obtain a photopolymerizable lithographic printing plate.

COMPARATIVE EXAMPLE 3

A photopolymerizable lithographic printing plate was prepared and developed in the same manner as in Example 5 except that as component (B), a cyanine dye which does not have a substituent having a cyclic ether bond formed on polymethine chain in the cyanine dye (B-2) used in Example

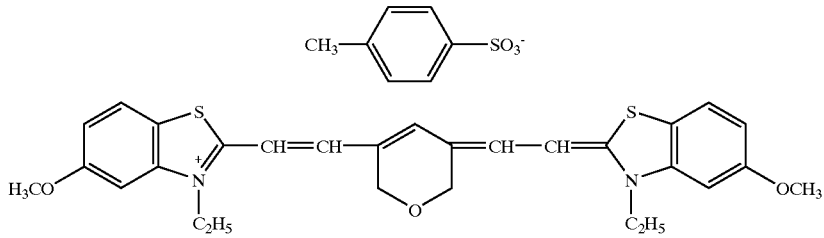

The obtained photopolymerizable lithographic printing plate was exposed and developed, and the sensitivity was evaluated in the same manner as in Example 1, whereby the maximum rotational speed was 650 rpm.

Further, the handling efficiency under a white fluorescent lamp was evaluated in the same manner as in Example 1 except that the light intensity was changed to 200 lux, whereby it was confirmed that there was no difference depending upon whether or not it was left to stand under the white fluorescent lamp.

EXAMPLE 6

A photopolymerizable lithographic printing plate was prepared and developed in the same manner as in Example 5 except that as component (C), 2-(p-i-propyloxystyryl)-4,6-bis(trichloromethyl)-s-triazine was used, whereby the maximum rotational speed of the exposure drum was 650 rpm.

EXAMPLE 7

A photopolymerizable lithographic printing plate was prepared and developed in the same manner as in Example 5 except that as component (C), an organic borate of a salt of n-butyl-tris(m-fluorophenyl) boron anion with tetra-n-butyl ammonium cation was used, whereby the maximum rotational speed of the exposure drum was 500 rpm.

EXAMPLE 8

A photopolymerizable lithographic printing plate was prepared and developed in the same manner as in Example 2 except that as component (B), a cyanine dye (B-2) of the following formula was used, whereby the maximum rotational speed of the exposure drum was 600 rpm.

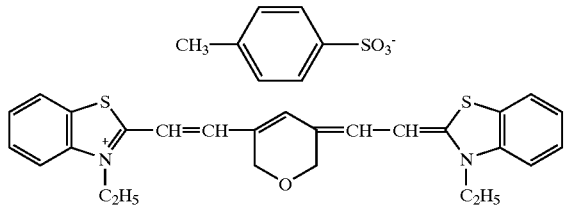

5, was used alone, whereby the maximum rotational speed of the exposure drum was not higher than 500 rpm. In the photopolymerizable composition layer, coating defects due to crystal particles of the cyanine dye, were observed.

EXAMPLE 9

An aluminum plate (thickness: 0.24 mm) subjected to graining treatment and anodic oxidation treatment, was used as a support, and on the surface of the aluminum plate support, a coating solution prepared by stirring 100 parts by weight of trimethylolpropane triacrylate as component (A), 2 parts by weight of a cyanine dye (B-3) of the following formula, as component (B), 5 parts by weight of 2-(p-methoxyphenyl)-4,6-bis(trichloromethyl)-s-triazine as component (C), and 100 parts by weight of a methyl methacrylate/methacrylic acid copolymer (molar ratio: 90/10, weight average molecular weight: 50,000) as a polymer binder, in 700 parts by weight of methyl cellosolve and 700 parts by weight of cyclohexanone at room temperature for 10 minutes, was coated by means of a wire bar and dried at 80° C. for 2 minutes, to form a layer of the photopolymerizable composition having a thickness of 2 μm. Further, an aqueous solution of a mixture of polyvinyl alcohol/polyvinylpyrrolidone (weight ratio of 90/10) was coated thereon and dried at 80° C. for 2 minutes, to form an overcoating layer having a thickness of 3 μm, to obtain a photopolymerizable lithographic printing plate.

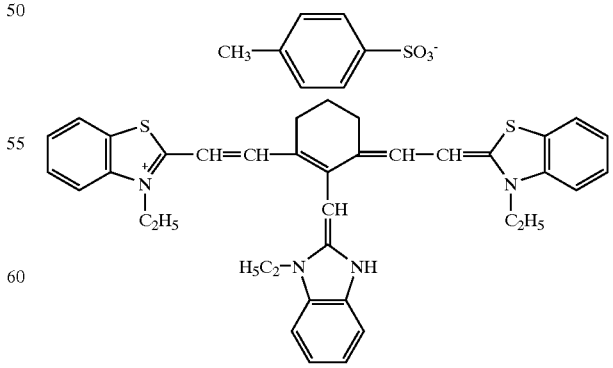

The obtained photopolymerizable lithographic printing plate was exposed and developed, and the sensitivity was evaluated in the same manner as in Example 1, whereby the maximum rotational speed was 600 rpm.

Further, the handling efficiency under a white fluorescent lamp was evaluated in the same manner as in Example 1 except that the light intensity was changed to 200 lux, whereby it was confirmed that there was no difference depending upon whether or not it was left to stand under the white fluorescent lamp.

EXAMPLE 10

A photopolymerizable lithographic printing plate was prepared and developed in the same manner as in Example 9 except that as component (C), 2-(p-i-propyloxystyryl)-4,6-bis(trichloromethyl)-s-triazine was used, whereby the maximum rotational speed of the exposure drum was 650 rpm.

EXAMPLE 11

A photopolymerizable lithographic printing plate was prepared and developed in the same manner as in Example 9 except that as component (C), an organic borate of a salt of a n-butyl-tris(m-fluorophenyl) boron anion with a tetra-n-butyl ammonium cation, was used, whereby the maximum rotational speed of the exposure drum was 500 rpm.

COMPARATIVE EXAMPLE 4

A photopolymerizable lithographic printing plate was prepared and developed in the same manner as in Example 9 except that as component (B), a cyanine dye which does not have a substituent containing an amino-vinyl bond on the polymethine chain in the cyanine dye (B-3) used in Example 9, was used alone, whereby the maximum rotational speed of the exposure drum was not higher than 200 rpm. In the photopolymerizable composition layer, coating defects due to crystal particles of the cyanine dye, were observed.

COMPARATIVE EXAMPLE 5

A photopolymerizable lithographic printing plate was prepared and developed in the same manner as in Example 9 except that as component (B), a cyanine dye which does not have a substituent containing an amino-vinyl bond on the polymethine chain in the cyanine dye (B-3) used in Example 9, was used alone, whereby the maximum rotational speed of the exposure drum was not higher than 200 rpm. In the photopolymerizable composition layer, coating defects due to crystal particles of the cyanine dye, were observed.

COMPARATIVE EXAMPLE 6

A photopolymerizable lithographic printing plate was prepared and developed in the same manner as in Example 9 except that as component (B), a cyanine dye of the following formula which has a diphenyl amino group as a substituent on the polymethine chain, was used instead of the cyanine dye (B-3) used in Example 9, whereby the maximum rotational speed of the exposure drum was not higher than 200 rpm.

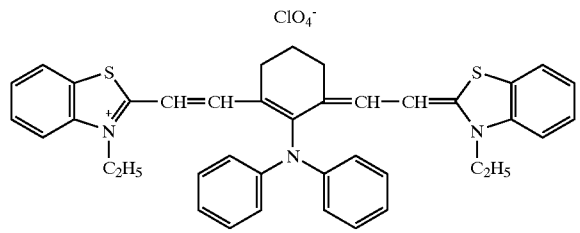

EXAMPLE 12

An aluminum plate (thickness: 0.24 mm) subjected to graining treatment and anodic oxidation treatment, was used as a support, and on the surface of the aluminum plate support, a coating solution prepared by stirring 100 parts by weight of trimethylolpropane triacrylate as component (A), 5 parts by weight of a cyanine dye (B-4) of the following formula, as component (B), 5 parts by weight of 2-(p-methoxyphenyl)-4,6-bis(trichloromethyl)-s-triazine as component (C), and 100 parts by weight of a methyl methacrylate/methylacrylate/methacrylic acid copolymer (molar ratio: 70/20/10, weight average molecular weight: 50,000) as a polymer binder, in 1,400 parts by weight of methyl cellosolve at room temperature for 10 minutes, was coated by means of a wire bar and dried at 80° C. for 2 minutes, to form a layer of the photopolymerizable composition having a thickness of 2 $\mu$m. Further, an aqueous polyvinyl alcohol solution was coated thereon and dried at 80° C. for 2 minutes, to form an overcoating layer having a thickness of 3 $\mu$m, to obtain a photopolymerizable lithographic printing plate.

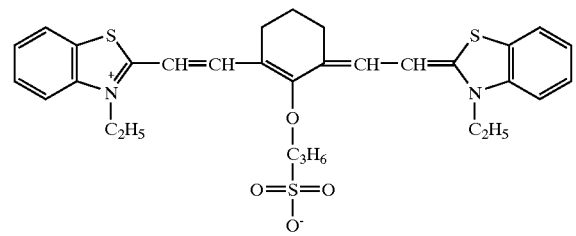

The obtained photopolymerizable lithographic printing plate was exposed and developed, and the sensitivity was evaluated in the same manner as in Example 1, whereby the maximum rotational speed was 600 rpm.

Further, the handling efficiency under a white fluorescent lamp was evaluated in the same manner as in Example 1, whereby it was confirmed that there was no difference depending upon whether or not it was left to stand under the white fluorescent lamp.

EXAMPLE 13

A photopolymerizable lithographic printing plate was prepared and developed in the same manner as in Example 12 except that as component (C), an organic borate of a salt of a n-butyl-triphenyl boron anion with a tetra-n-butyl ammonium cation was used, whereby the maximum rotational speed of the exposure drum was 500 rpm.

EXAMPLE 14

A photopolymerizable lithographic printing plate was prepared and developed in the same manner as in Example 2 except that as component (B), a cyanine dye (B-4) of the following formula was used, whereby the maximum rotational speed of the exposure drum was 600 rpm.

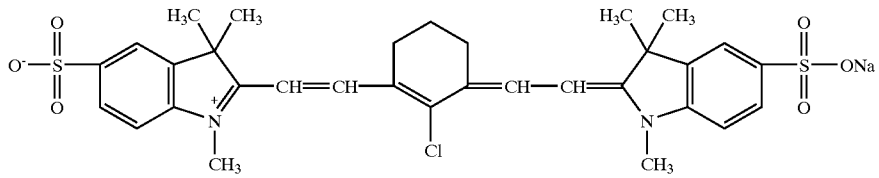

COMPARATIVE EXAMPLE 7

A photopolymerizable lithographic printing plate was prepared and developed in the same manner as in Example 12 except that as component (B), a cyanine dye which does not have a substituent containing an acid anion group on the polymethine chain in the cyanine dye (B-4) as used in Example 12, was used alone, whereby the maximum rotational speed of the exposure drum was not higher than 200 rpm. In the photopolymerizable composition layer, coating defects due to crystal particles of the cyanine dye, were observed.

COMPARATIVE EXAMPLE 8

A photopolymerizable lithographic printing plate was prepared and developed in the same manner as in Example 12 except that as component (B), a cyanine dye which does not have a substituent containing an acid anion group on the condensed benzene ring in the cyanine dye (B-4) as used in Example 14, was used alone, whereby the maximum rotational speed of the exposure drum was not higher than 200 rpm. In the photopolymerizable composition layer, coating defects due to crystal particles of the cyanine dye, were observed.

INDUSTRIAL APPLICABILITY

According to the present invention, it is possible to provide a photopolymerizable composition and a photopolymerizable lithographic printing plate, which shows high sensitivity to light in a visible light region or in a long wavelength region such as a near infrared region and which is insensitive to light in the ultraviolet region and thus is excellent in the handling efficiency under a white fluorescent lamp. Further, the photopolymerizable composition of the present invention is excellent in the solubility in a solvent, whereby it is possible to effectively form a layer of the photopolymerizable composition by coating it on a substrate surface in the form of a solution and thereby provide a photopolymerizable lithographic printing plate excellent in the productivity.

The entire disclosures of Japanese Patent Application No. 11-235216 filed on Aug. 23, 1999, Japanese Patent Application No. 2000-200400 filed on Jul. 3, 2000, Japanese Patent Application No. 2000-207841 filed on Jul. 10, 2000 and Japanese Patent Application No. 2000-207842 filed on Jul. 10, 2000 including specifications, claims and summaries are incorporated herein by reference in their entireties.

What is claimed is:

1. A photopolymerizable composition comprising the following components (A), (B) and (C):

(A) an ethylenically unsaturated compound;
(B) a dye which has, as a basic structure, a structure having hetero atoms connected via a polymethine chain and which is selected from the group consisting of the following (B-1), (B-2), (B-3) and (B-4):
(B-1) a dye having, on a polymethine chain, a substituent containing a chain ether bond which forms an oxonium cation or a chain thioether bond which forms a sulfonium cation, upon resonance in the dye molecule,
(B-2) a dye having, on a polymethine chain, two substituents forming a cyclic ether bond which forms an oxonium cation or a cyclic thioether bond which forms a sulfonium cation, upon resonance in the dye molecule, wherein the two substituents forming a cyclic ether bond or a cyclic thioether bond have a trimethine group represented by the following formula (VIa):

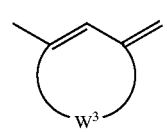

(VIa)

wherein $W^3$ is an oxygen atom or a sulfur atom, and the hetero ring containing $W^3$ is a substituted or unsubstituted 5- or 6-membered ring,
(B-3) a dye having, on a polymethine chain, a substituent containing an amino-vinyl bond which forms an aminium cation upon resonance in the dye molecule, and
(B-4) a dye having, on a polymethine chain or other basic structure, a substituent containing a sulfonic acid anion group; and
(C) a photopolymerization initiator.

2. The photopolymerizable composition according to claim 1, wherein the basic structure of the dye of component (B) is a cyanine dye of a structure having hetero rings connected via a polymethine chain.

3. The photopolymerizable composition according to claim 2, wherein the cyanine dye as the basic structure is a near infrared absorbing dye of the following formula (II):

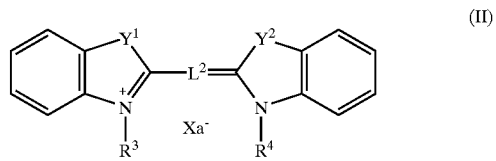

(II)

wherein each of $Y^1$ and $Y^2$ which are independent of each other, is a dialkylmethylene group or a sulfur atom, each of $R^3$ and $R^4$ which are independent of each other, is an alkyl group which may have a substituent, an alkenyl group which may have a substituent, an alkynyl group which may have a substituent, or a phenyl group which may have a substituent, $L^2$ is a tri-, penta-, hepta-, nona- or undeca-methine group which may have a substituent, and two substituents on the penta-, hepta-, nona- or undeca-methine group, may be connected to each other to form a $C_{5-7}$ cycloalkene ring, cycloalkenone ring, cycloalkendione ring or cycloalkenthione ring, the condensed benzene ring may have substituents, whereby adjacent two substituents may be connected to each other to form a condensed benzene ring, and $X_a^-$ is a counter anion.

4. The photopolymerizable composition according to claim 1, wherein the dye of component (B) is the dye (B-1).

5. The photopolymerizable composition according to claim 4, wherein the substituent containing a chain ether bond or a chain thioether bond on the polymethine chain in the dye (B-1), is one represented by the following formula (Va):

(Va)

wherein $W^1$ is an oxygen atom or a sulfur atom, and $R^a$ is an alkyl group which may have a substituent, an aryl group which may have a substituent, or a hetero cyclic group which may have a substituent.

6. The photopolymerizable composition according to claim 5, wherein the substituent containing a chain ether bond or a chain thioether bond on the polymethine chain in the dye (B-1), is one represented by the following formula (Vb):

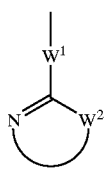

(Vb)

wherein $W^1$ is an oxygen atom or a sulfur atom, $W^2$ is an oxygen atom, a sulfur atom, a nitrogen atom or a dialkylmethylene group, $W^1$ and $W^2$ may be the same or different, and the hetero ring is a 4- to 6-membered ring which may have substituents, whereby adjacent two substituents may be connected to each other to form a condensed ring.

7. The photopolymerizable composition according to claim 6, wherein the substituent containing a chain ether bond or a chain thioether bond on the polymethine chain in the dye (B-1), is one represented by the following formula (Vc):

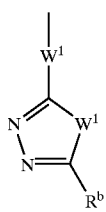

(Vc)

wherein $W^1$ is an oxygen atom or a sulfur atom, the two $W^1$ may be the same or different, and $R^b$ is an alkyl group which may have a substituent, an alkoxy or thioalkoxy group which may have a substituent, an aryl group which may have a substituent, a hetero cyclic group which may have a substituent, or a hydrogen atom.

8. The photopolymerizable composition according to claim 1, wherein the dye of component (B) is (B-2) and the two substituents forming a cyclic ether bond or a cyclic thioether bond on the polymethine chain have a trimethine group represented by the following formula (VIb):

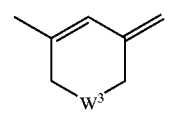

(VIb)

wherein $W^3$ is an oxygen atom or a sulfur atom, and the hetero ring containing $W^3$ may have a substituent.

9. The photopolymerizable composition according to claim 1, wherein the dye of component (B) is the dye (B-3).

10. The photopolymerizable composition according to claim 9, wherein the substituent containing an amino-vinyl bond on the polymethine chain in the dye (B-3), is one represented by the following formula (VIIa):

(VIIa)

wherein $R^d$ is an amino group which may have a substituent, the vinyl group may have a substituent, and the substituent on the amino group and the substituent on the vinyl group may be connected to each other to form a hetero ring.

11. The photopolymerizable composition according to claim 10, wherein the substituent containing an amino-vinyl bond on the polymethine chain in the dye (B-3), is one represented by the following formula (VIIb):

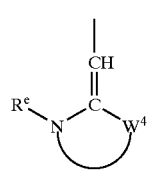

(VIIb)

wherein $W^4$ is an oxygen atom, a sulfur atom, a nitrogen atom or a dialkylmethylene group, $R^e$ is an alkyl group which may have a substituent, an aryl group which may have a substituent, or a hydrogen atom, and the hetero ring is a 4- to 6-membered ring which may have substituents, whereby adjacent two substituents may be connected to each other to form a condensed ring.

12. The photopolymerizable composition according to claim 11, wherein the substituent containing an amino-vinyl bond on the polymethine chain in the dye (B-3), is one represented by the following formula (VIIc):

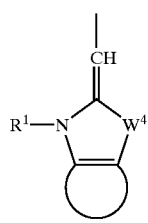 (VIIc)

wherein $W^4$ is an oxygen atom, a sulfur atom, a nitrogen atom or a dialkylmethylene group, $R^f$ is an alkyl group which may have a substituent, or an aryl group which may have a substituent, and the condensed ring represents an aromatic hydrocarbon ring.

13. The photopolymerizable composition according to claim 1, wherein the photopolymerization initiator of component (C) is a bis(trihalomethyl)-s-triazine compound or an organic borate.

14. The photopolymerizable composition according to claim 1, wherein the dye of component (B) and the photopolymerization initiator of component (C) are a salt formed by a dye cation of the dye of component (B) and the organic boron anion of the organic borate of component (C).

15. The photopolymerizable composition according to claim 1, wherein the ethylenically unsaturated compound of component (A) is an acrylate compound, of which the ethylenically unsaturated double bond is derived from a (meth)acryloyloxy group.

16. The photopolymerizable composition according to claim 1, wherein the proportions of components (A), (B) and (C) are such that the total amount of components (B) and (C) is from 0.1 to 30 parts by weight per 100 parts by weight of component (A).

17. The photopolymerizable composition of claim 1, wherein component (B) is the dye (B-2).

18. The photopolymerizable composition of claim 1, wherein component (B) is the dye (B-4).

19. A photopolymerizable lithographic printing plate comprising a support and a layer of a photopolymerizable composition as defined in claim 1 formed on the surface of the support.

* * * * *